(12) United States Patent
Goel et al.

(10) Patent No.: US 9,110,136 B2
(45) Date of Patent: *Aug. 18, 2015

(54) CIRCUIT AND METHOD FOR MONOLITHIC STACKED INTEGRATED CIRCUIT TESTING

(71) Applicant: Taiwan Semiconductor Manufacturing Company, Ltd., Hsin-Chu (TW)

(72) Inventors: Sandeep Kumar Goel, Dublin, CA (US); Ashok Mehta, Los Gatos, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 90 days.

This patent is subject to a terminal disclaimer.

(21) Appl. No.: 14/039,789

(22) Filed: Sep. 27, 2013

(65) Prior Publication Data
US 2015/0095729 A1 Apr. 2, 2015

(51) Int. Cl.
*G01R 31/28* (2006.01)
*G01R 31/3177* (2006.01)

(52) U.S. Cl.
CPC .................. *G01R 31/3177* (2013.01)

(58) Field of Classification Search
CPC ............ H01L 25/0657; H01L 25/0652; H01L 2924/14; H01L 2924/3011; H01L 2924/1305; H01L 2924/15311; H01L 2224/73265; H01L 2224/73204; H01L 2224/48227; H01L 2224/48091; H01L 2224/32225; H01L 2224/32145; H01L 2224/16225; H01L 2224/16145

See application file for complete search history.

(56) References Cited

U.S. PATENT DOCUMENTS

| | | | |
|---|---|---|---|
| 8,669,778 B1 * | 3/2014 | Or-Bach et al. .................. | 326/37 |
| 2012/0193621 A1 * | 8/2012 | Or-Bach et al. .................. | 257/48 |
| 2012/0193681 A1 * | 8/2012 | Or-Bach ........................ | 257/208 |
| 2012/0193806 A1 * | 8/2012 | Or-Bach et al. ............... | 257/774 |

OTHER PUBLICATIONS

Design for Pre-bond Testability in 3D Integrated Circuits Dean L. Lewins—2012 pp. 1-131.*
Sandeep Kumar Goel, U.S. Appl. No. 14/027,976 entitled "Circuit and Method for Monolithic Stacked Integrated Circuit Testing," filed Sep. 16, 2013, 28 pages of text, 22 pages of drawings.
Sandeep Kumar Goel, U.S. Appl. No. 14/030,684 entitled "Circuit and Method for Monolithic Stacked Integrated Circuit Testing," filed Sep. 18, 2013, 28 pages of text, 21 pages of drawings.

* cited by examiner

*Primary Examiner* — Guerrier Merant
(74) *Attorney, Agent, or Firm* — Haynes and Boone, LLP

(57) ABSTRACT

A monolithic stacked integrated circuit (IC) is provided with a known-good-layer (KGL) test circuit and a scan segment in one of its upper layers. The test circuit includes a plurality of inputs, outputs, and multiplexers coupled to the scan segment and to a second layer of the IC. The test circuit further includes a plurality of control elements such that scan testing of the stacked IC may be conducted on a layer-by-layer basis.

20 Claims, 23 Drawing Sheets

CIRCUIT AND METHOD FOR MONOLITHIC STACKED INTEGRATED CIRCUIT TESTING

The present disclosure is related to the following commonly-assigned U.S. patent applications, the entire disclosure of which are incorporated herein by reference: U.S. Ser. No. 14/027,976 entitled "CIRCUIT AND METHOD FOR MONOLITHIC STACKED INTEGRATED CIRCUIT TESTING," filed Sep. 16, 2013 by inventor Sandeep Kumar Goel and U.S. Ser. No. 14/030,684 entitled "CIRCUIT AND METHOD FOR MONOLITHIC STACKED INTEGRATED CIRCUIT TESTING," filed Sep. 18, 2013 by inventor Sandeep Kumar Goel.

BACKGROUND

Ongoing trends in semiconductor device technology include miniaturization of feature size of semiconductor devices as well as increasing functional complexity of semiconductor devices. Although a feature size reduction may facilitate an increase in the number of semiconductor building blocks per unit area of a semiconductor device, e.g. a die or an integrated circuit (IC), thus facilitating more complex functionality per device, many demands for the increased functional complexity cannot be met by a single device.

Recently, this has led to the development of aggregate devices such as three-dimensional integrated circuits (3D ICs). One example of creating a 3D IC is by building electronic components and their connections in layers on a single semiconductor wafer. As a base layer of the IC is formed on a substrate, a first upper layer is formed over the base layer and is connected to the base layer using vias. Another upper layer may be formed over the first upper layer, and so on. In this way, the IC is sequentially grown layer by layer. An IC thus built is generally known as a monolithic stacked IC.

Though promising in providing density and performance benefits in advanced process nodes, such as 28 nm and below, the method of creating monolithic stacked ICs aforementioned has its own challenges. One of the challenges is directed to manufacture fault testing of monolithic stacked ICs. Conventional IC manufacture fault testing employs a known-good-die (KGD) concept where a pre-fabricated die is tested with a suite of test patterns such as supply open/short test, ground open/short test, stuck-at fault test, current consumption tests (e.g., IDDQ), timing path delay fault (or transition fault) test, etc. If a die is found with defects, it is removed from further processing, such as packaging, to save cost. The manufacture fault testing is typically enabled by a structured test architecture. This KGD concept has been found less desirable in monolithic stacked IC manufacture fault testing. This is primarily due to the fact that complete logic generally spans over multiple layers in a monolithic stacked IC and complete fault testing with quality similar to or higher than KGD testing cannot be applied until all or multiple layers are built. Yet, waiting until all or multiple layers are built before applying fault testing presents a significant yield loss issue. In addition, testing of each layer during manufacturing of monolithic stacked ICs enables defect isolation and yield tracking per layer, which can be really helpful in finding layer manufacturing processing related issues.

Accordingly, an enhancement in monolithic stacked IC manufacture fault testing is needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
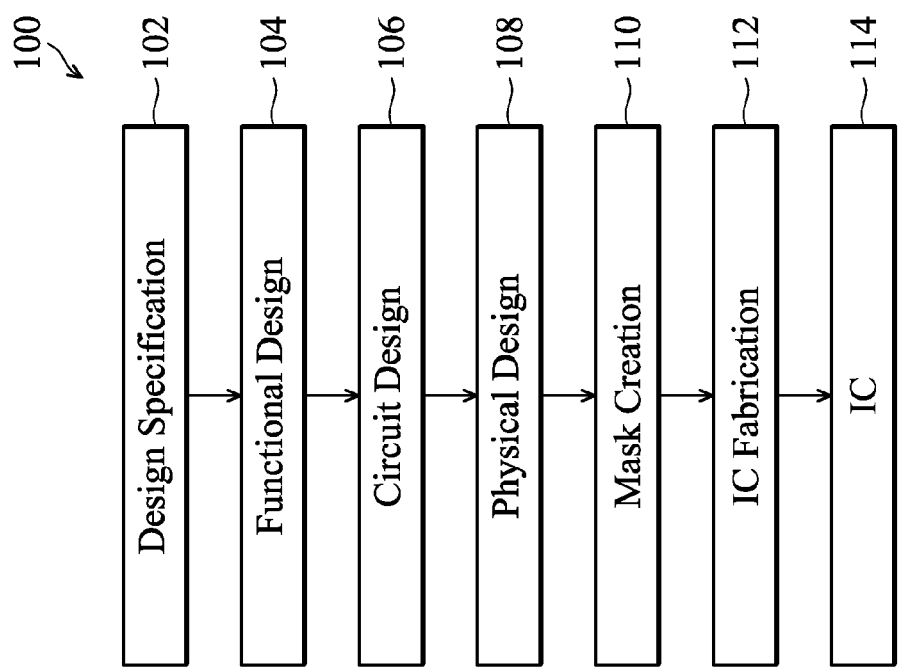
FIG. 1 is a simplified block diagram of an embodiment of an integrated circuit (IC) design and manufacturing flow.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure relates generally to fault testing of semiconductor devices, and more particularly, to a layer-by-layer fault testing when fabricating monolithic stacked integrated circuits. Specific embodiments are provided as examples to teach the broader inventive concept, and one of ordinary skill in the art can easily apply the teaching of the present disclosure to other methods or apparatus.

FIG. 1 is a simplified block diagram of an embodiment of an integrated circuit (IC) design and manufacturing flow 100 to produce an IC 114. In the present embodiment, the IC 114 is a monolithic stacked IC that includes a base layer and one or more upper layers. The IC design flow 100 typically starts with a design specification 102 which includes the design requirements of the IC 114. It then proceeds to functional design 104 where the design of the IC 114 is partitioned into a plurality of layers and the plurality of layers interact to produce the desired embodiment.

The IC design flow 100 (FIG. 1) proceeds to circuit design 106. In an embodiment, the IC design is described in Register Transfer Level (RTL) language such as Verilog or VHDL and then is synthesized into a netlist. In another embodiment, the IC design is described graphically in schematic. In an embodiment, the IC design includes not only circuits for the intended functionality of the IC 114, but also circuits for uncovering faults (or defects) during IC fabrication 112. This is commonly referred to as Design for Test (DFT) circuits. In general, the faults are the results of semiconductor manufacture process abnormalities, imperfections and process variations. For example, material may be formed where it should not be or material may be absent where it should be. The faults can be modeled at various levels of design abstraction. Two commonly used fault models are stuck-at-0 (SA0) and stuck-at-1 (SA1) fault models. During fault testing, a fault is detected when a particular test pattern activates or sensitizes the IC 114 to the fault and makes the error observable.

Structured fault testing architecture and automatic test pattern generation (ATPG) are frequently used in DFT. For example, basic scan architecture for an IC typically includes a scan enable input, a scan clock input, and a plurality of scan chains. Each scan chain includes a scan input, a scan output and a plurality of scan flip-flops of the IC in between the scan input and the scan output. The scan enable input controls the IC into one of two test modes: a shift test mode and a capture test mode. In the shift test mode, the plurality of flip-flops in each scan chain forms a chain of serial shift registers. Test pattern data is serially shifted into the scan chain through the scan input at a pace controlled by the scan clock input. At the same time, data in the scan chain is shifted out of and observed at the scan output. In the capture test mode, the plurality of scan flip-flops in each scan chain assumes their respective role in functional mode (non-test mode). When one or more clock signals are applied at the scan clock input, the plurality of scan flip-flops captures results of the test. A subsequent shift operation shifts the results out of the scan output and compares the results with predetermined targets to detect whether faults are present in the IC. Various enhancements may be added to the basic scan architecture described above. In an embodiment, test compression logic is added to include more than one scan chains in between one scan input and one scan output thereby to improve test efficiency.

The scan architecture aforementioned works well with a pre-fabricated die, but not with a monolithic stacked IC where complete logic of the IC is not present until all layers of the IC is fabricated. In practice, it is desirable to detect faults as each layer of the IC is fabricated. For example, if one layer of the IC is found defective, the IC can be removed from further manufacturing process thereby to save processing and/or manufacturing cost. If removing of the IC is not possible or is not cost-effective, the particular IC/die location can be marked defective and no further testing is performed on that location in future processing and testing steps. This results in test cost savings. This layer-by-layer testing in stacked IC fabrication is called known-good-layer (KGL) testing in the present disclosure. Various embodiments of the present disclosure are related to KGL testing and will be described in more details below.

The IC design flow 100 (FIG. 1) proceeds to physical design 108 where an IC design layout is produced. The IC design layout includes various geometrical patterns designed for the IC 114. The geometrical patterns correspond to patterns of metal, oxide, or semiconductor material layers that make up the various components of the IC device 114 to be fabricated. The various material layers combine to form various IC features in each layer of the IC 114.

With the IC design layout, the IC design flow 100 (FIG. 1) proceeds to mask creation 110 to produce one or more masks to be used for fabricating the various layers of the IC product according to the IC design layout. The mask creation 110 includes various tasks such as mask data preparation, where the IC design layout is translated into a form that can be physically written by a mask writer, and mask fabrication, where the design layout prepared by the mask data preparation is modified to comply with a particular mask writer and/or mask manufacturer and is then fabricated.

After the mask (or masks) has been fabricated, the IC design flow 100 (FIG. 1) proceeds to IC fabrication 112. The IC fabrication may be done by a myriad of manufacturing facilities. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

In an embodiment, a semiconductor wafer is fabricated using the mask (or masks) to form the IC device 114. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). In the present embodiment, the IC device 114 includes a base layer formed over a substrate and a plurality of upper layers formed over the base layer. The base layer and the plurality of upper layers may be inter-connected using through-layer vias (TLV). As each layer of the IC 114 is fabricated, a KGL testing according to various aspects of the present disclosure is performed to detect faults on the IC 114.

After being fabricated and tested fault free, the IC devices typically go through a packaging and further testing process before being delivered to market.

Figure 2:
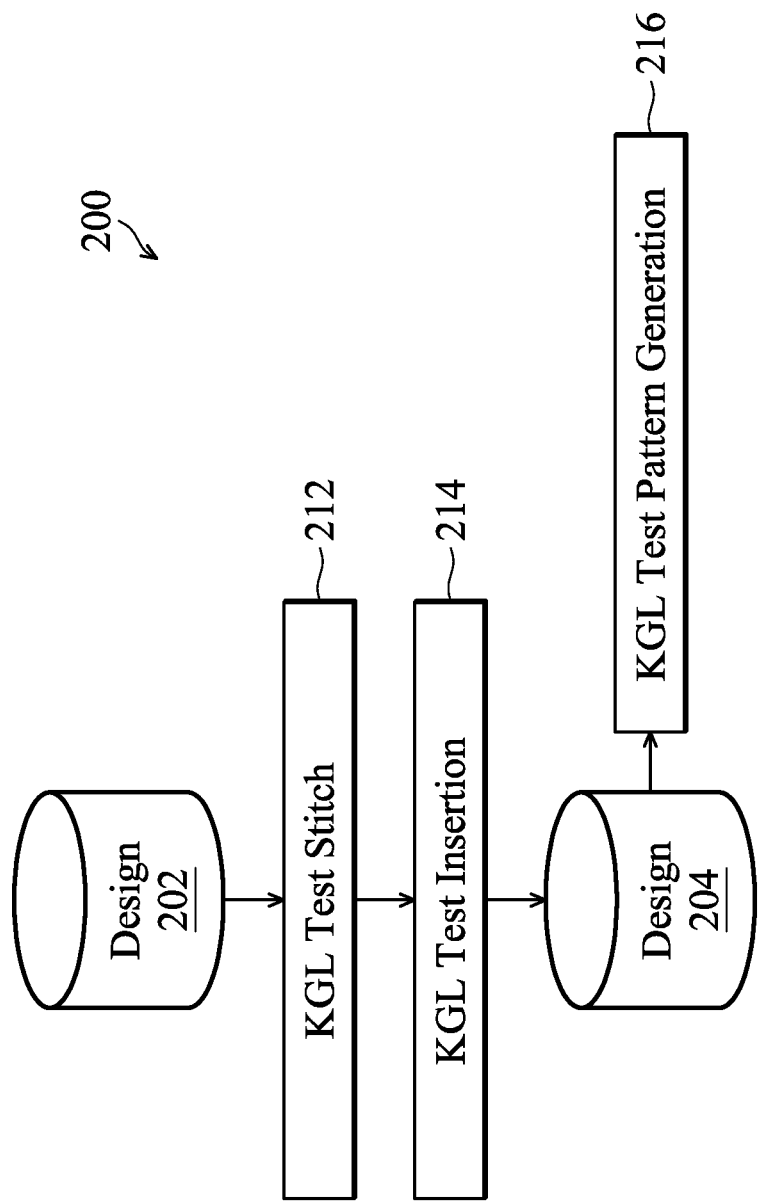
FIG. 2 is an embodiment of a part of the IC circuit design phase shown in FIG. 1 according to various aspects of the present disclosure.

FIG. 2 illustrates an embodiment of a method 200 of KGL test insertion and test pattern generation as part of the circuit design 106 (FIG. 1) according to various aspects of the present disclosure. The KGL test method 200 receives a design 202 where the circuits of the IC 114 have been partitioned into a base layer and a plurality of upper layers with each layer having scan flip-flops and/or other circuit components suitable for scan testing.

Figure 3:
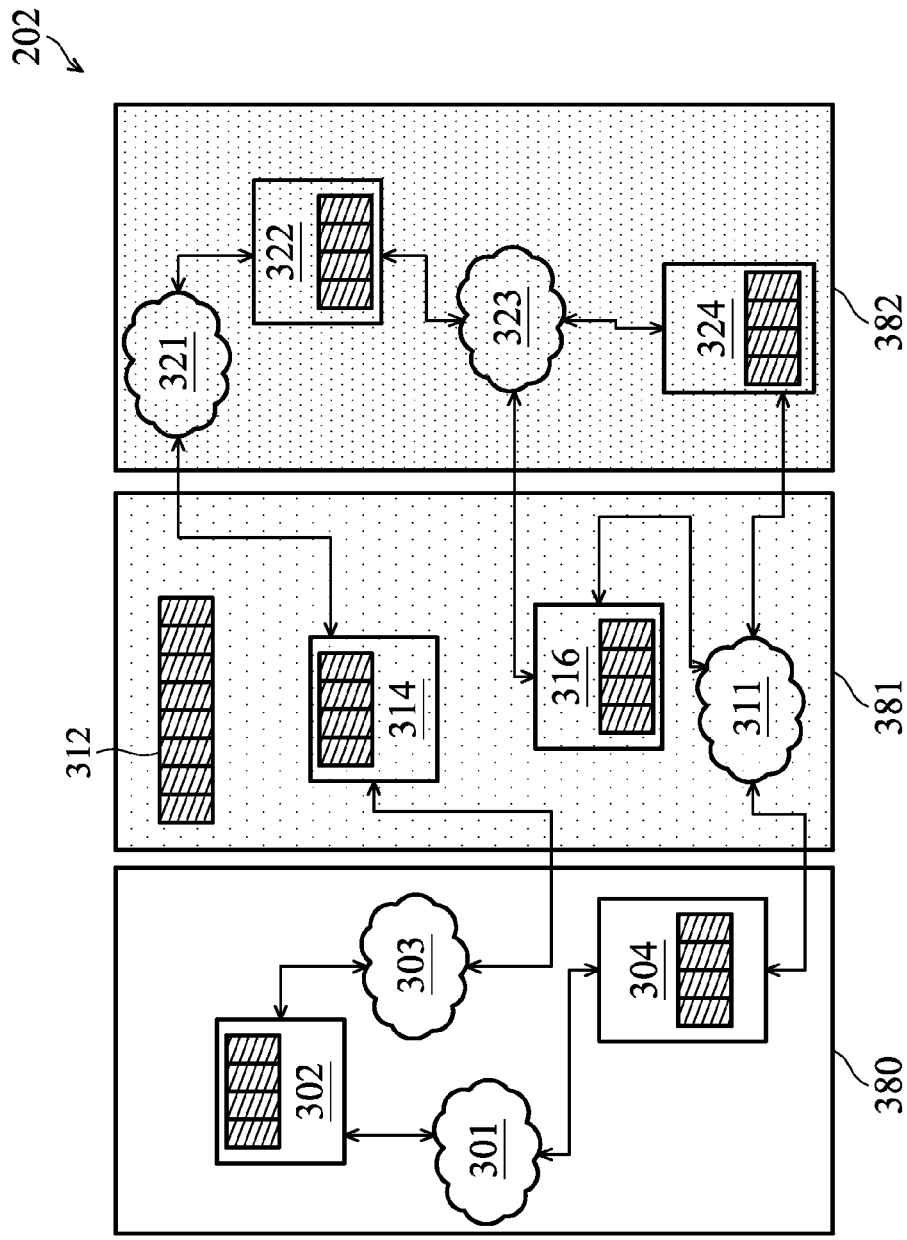
FIG. 3 illustrates a simplified graphical representation of an embodiment of a monolithic stacked IC design.

One example of the design 202 is shown in FIG. 3. As illustrated in FIG. 3, the design 202 includes a base layer 380, a first upper layer 381 and a second upper layer 382. The base layer 380 includes two pluralities of scan flip-flops, 302 and 304, and two logic clouds, 301 and 303. The first upper layer 381 includes three pluralities of scan flip-flops, 312, 314 and 316, and one logic cloud 311. The second upper layer 382 includes two pluralities of scan flip-flops, 322 and 324, and two logic clouds, 321 and 323. There may be interconnects between one layer and another layer. In an embodiment, some scan flip-flops in one layer may have already been stitched into one or more serial shift registers for scan test purposes which are called scan segments. For the following discussion, a pre-stitched scan segment is treated the same way as a scan flip-flop without limiting the present disclosure. In an embodiment, a scan flip-flop is register based. In an embodiment, a scan flip-flop is latch based.

Figure 4:
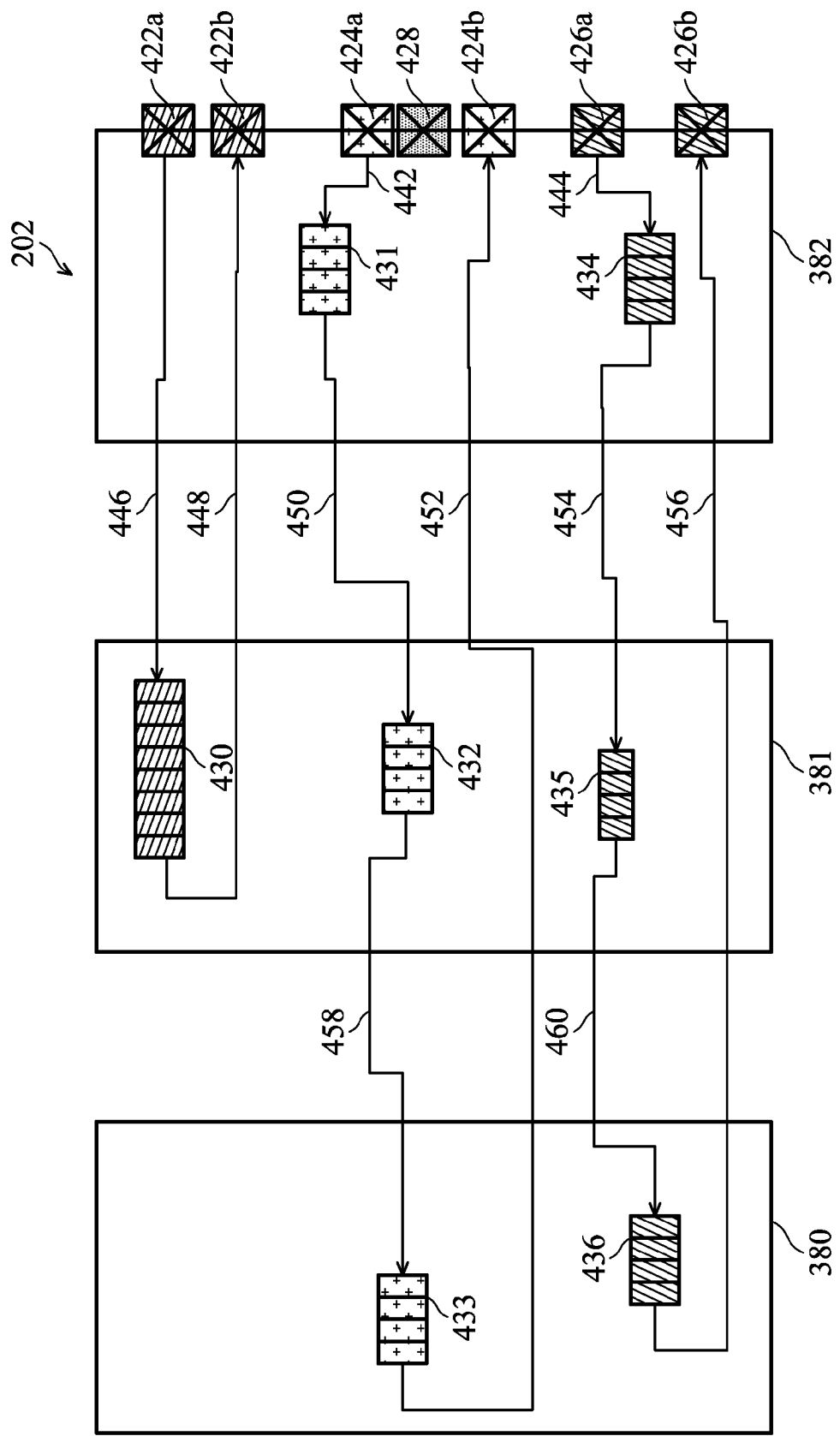
FIGS. 4 and 5 illustrate scan test architecture in a monolithic stacked IC design according to various aspects of the present disclosure.

The KGL test method 200 (FIG. 2) proceeds to operation 212 to create a plurality of scan inputs, a plurality of scan outputs, a scan enable signal and a scan clock signal. Scan flip-flops in design 202 are subsequently stitched into a plurality of scan chains. Referring to FIG. 4, for simplicity purposes, only scan chains are shown and the scan enable signal, scan clock signal, and various features of design 202 are omitted. However, those of ordinary skill in the art should appreciate that such omission does not limit the inventive scope of the present disclosure.

Referring again to FIG. 4, in the present embodiment, IO pads, 422a, 422b, 424a, 424b, 426a, 426b and 428, are included in the second upper layer 382 for scan testing purposes. The input pad 428 is included for controlling various KGL test circuits according to various aspect of the present disclosure. In an embodiment, these IO pads are shared with functional pins of the IC 114. Design 202 further includes three scan chains. A first scan chain includes the IO pad 422a as a scan input, the IO pad 422b as a scan output, and a plurality of scan flip-flops 430. The scan input 422a is coupled to an input of the scan flip-flops 430 via node 446. An output of the scan flip-flops 430 is coupled to the scan output 422b via node 448. A second scan chain includes the IO pad 424a as a scan input, the IO pad 424b as a scan output, and three pluralities of scan flip-flops, 431, 432 and 433. The scan input 424a is coupled to an input of the scan flip-flops 431 via node 442. An output of the scan flip-flops 431 is coupled to an input of the scan flip-flops 432 via node 450. An output of the scan flip-flops 432 is coupled to an input of the scan flip-flops 433 via node 458. An output of the scan flip-flips 433 is coupled to the scan output 424b via node 452. A third scan chain includes the IO pad 426a as a scan input, the IO pad 426b as a scan output, and three pluralities of scan flip-flops, 434, 435 and 436. The scan input 426a is coupled to an input of the scan flip-flops 434 via node 444. An output of the scan flip-flops 434 is coupled to an input of the scan flip-flops 435 via node 454. An output of the scan flip-flops 435 is coupled to an input of the scan flip-flops 436 via node 460. An output of the scan flip-flops 436 is coupled to the scan output 426b via node 456. In following discussions, each scan chain is denoted by its scan input and scan output pair for simplicity purposes. For example, the first scan chain is denoted as 422a/422b.

Figure 5:
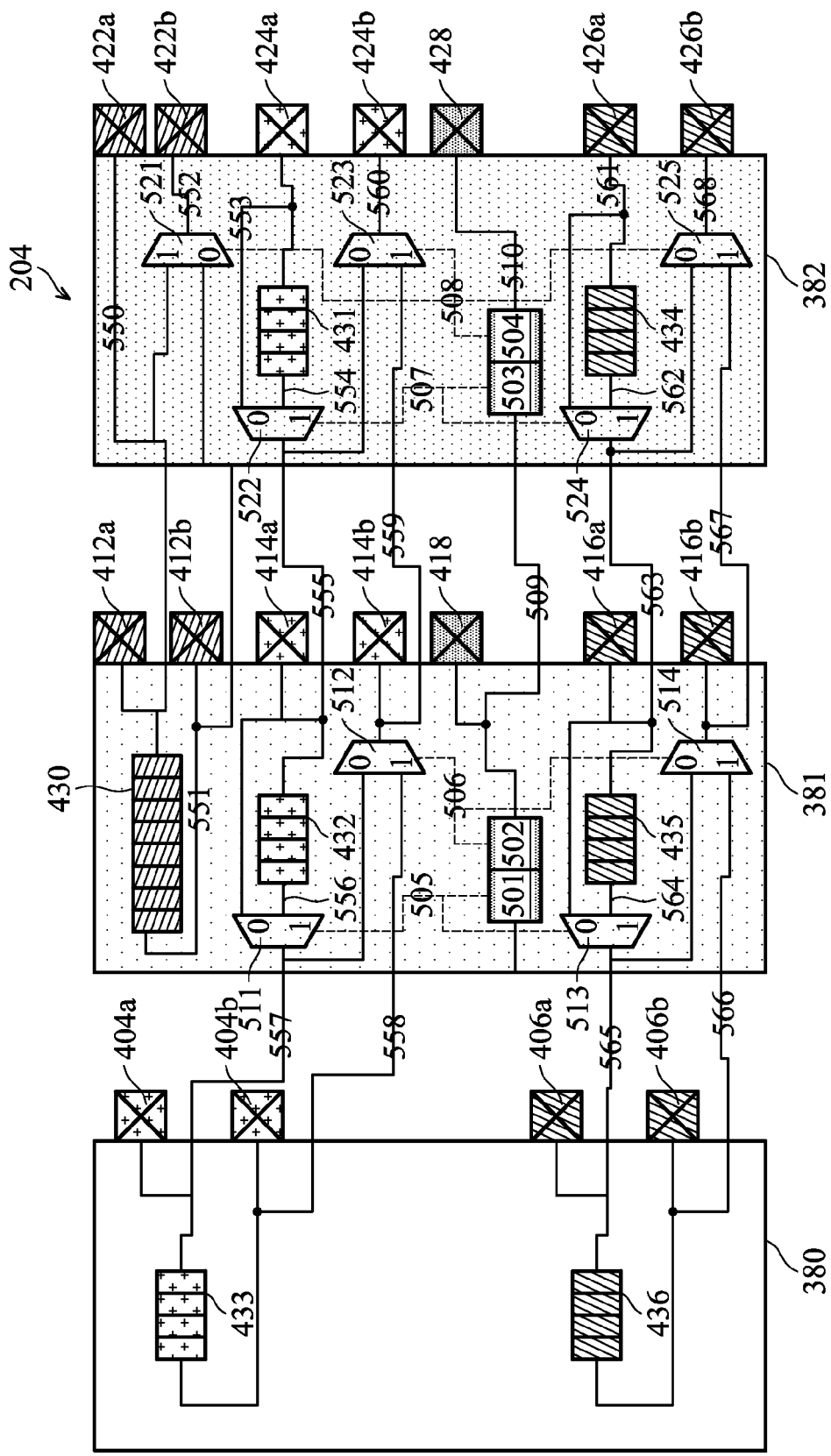

The KGL test method 200 (FIG. 2) proceeds to operation 214 where KGL test circuits are inserted into the design 202 thereby to produce a KGL test compliant design 204. Referring to FIG. 5, the KGL test circuits include a plurality of test IO pads, 404a, 404b, 406a and 406b, at the base layer 380; a plurality of test IO pads, 412a, 412b, 414a, 414b, 416a and 416b, at the first upper layer 381; a plurality of test control elements, 501, 502, 503 and 504; a plurality of multiplexers, 511, 512, 513, 514, 521, 522, 523 and 524; and a plurality of nodes coupling the test control elements, the multiplexers and the scan chains. Various functions of the test control elements and the multiplexers are described in more details below.

There are at least two categories of multiplexers in the KGL test circuits: scan-in bypass multiplexers and scan-out bypass multiplexers. A scan-in bypass multiplexer has a function of passing scan shift data of a scan chain from an input of a layer directly to an output of the layer, thus bypassing scan flip-flops of the scan chain between the input and the output of the layer. Referring to FIG. 5, in the present embodiment, multiplexers 511, 513, 522 and 524 are scan-in bypass multiplexers. Taking multiplexer 522 as an example, scan input 424a is coupled to both an input of scan flip-flops 431 and an input of multiplexer 522 via node 553. An output of scan flip-flops 431 is coupled to another input of multiplexer 522. An output of test control element 503 is coupled to a selection input of multiplexer 522 via node 507. Thus, scan shift data from either scan input 424a or the output of scan flip-flops 431 may be passed to node 555 through multiplexer 522 depending on a value of test control element 503. The other scan-in bypass multiplexers may be analyzed similarly. A scan-out bypass multiplexer in a layer has a function of passing data to an output of the layer towards a scan output of a scan chain from either a lower layer output or an output of a scan-in bypass multiplexer of the scan chain in the layer. Referring again to FIG. 5, in the present embodiment, multiplexers 512, 514, 521, 523 and 525 are scan-out bypass multiplexers. Taking multiplexer 523 as an example, an input of multiplexer 523 is coupled to an output of layer 381 via node 559. Another input of multiplexer 523 is coupled to an output of scan-in bypass multiplexer 522 via node 555. A selection input of multiplexer 523 is coupled to test control element 504 via node 508. An output of multiplexer 523 is coupled to scan output 424b via node 560. Thus, either data from layer 381 or data from scan-in bypass multiplexer 522 may be passed to scan output 424b depending on a value of test control element 504. The other scan-out bypass multiplexers may be analyzed similarly. Further observations are made with reference to FIG. 5. In the present embodiment, there is a pair of a scan-in bypass multiplexer and a scan-out bypass multiplexer for each scan chain in each layer when the scan chain goes from the layer to another layer, with an exception of the scan chain 422a/422b at the second upper layer 382. That is because the second upper layer 382 does not include any scan flip-flop of the scan chain 422a/422b and a scan-in bypass multiplexer for the scan chain 422a/422b at the second upper layer 382 is degenerated into a wire and is merged into node 550.

Figure 6:
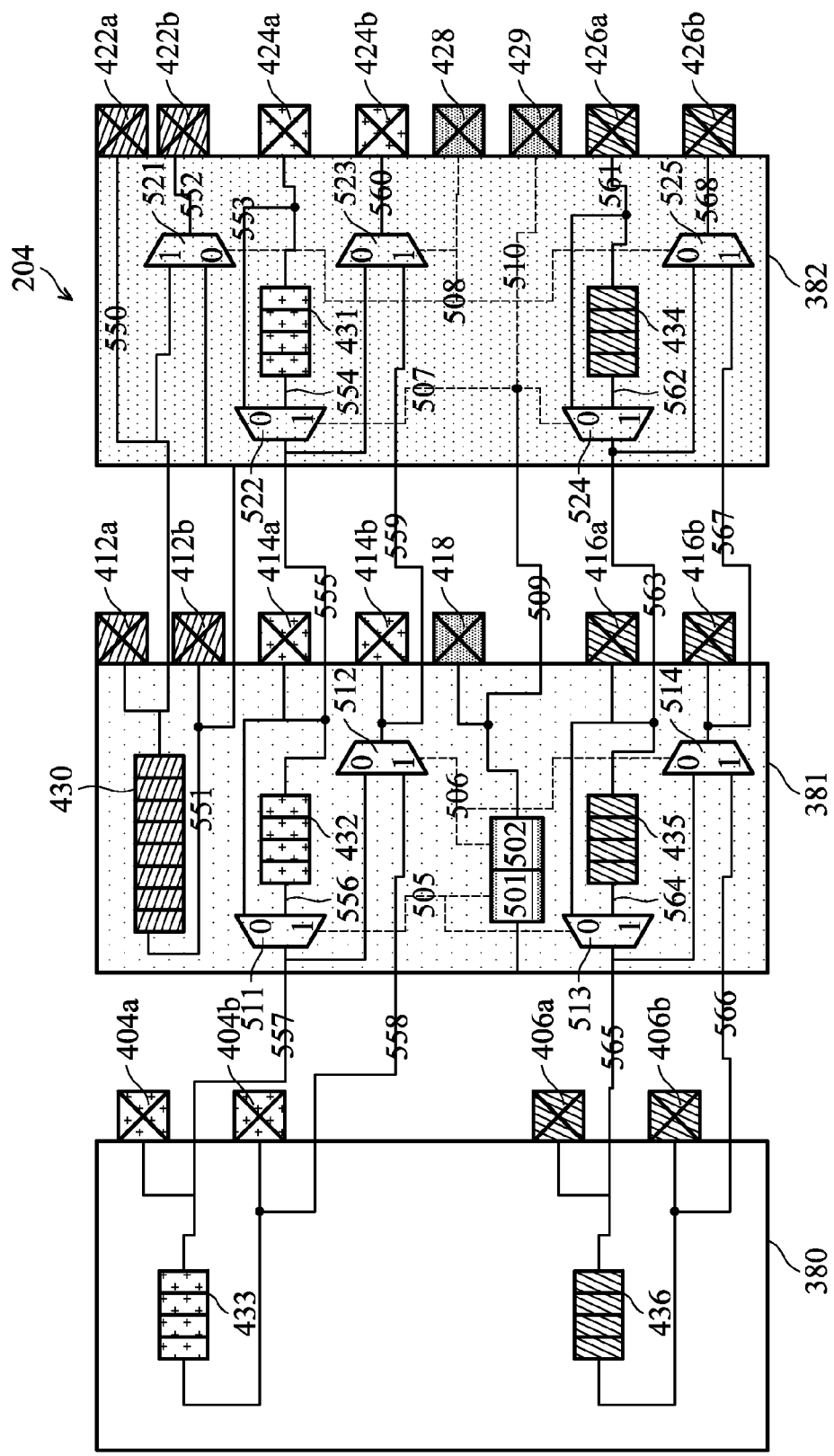
FIGS. 6 and 7 illustrate embodiments of scan test architecture in a monolithic stacked IC design according to various aspects of the present disclosure.
Figure 7:
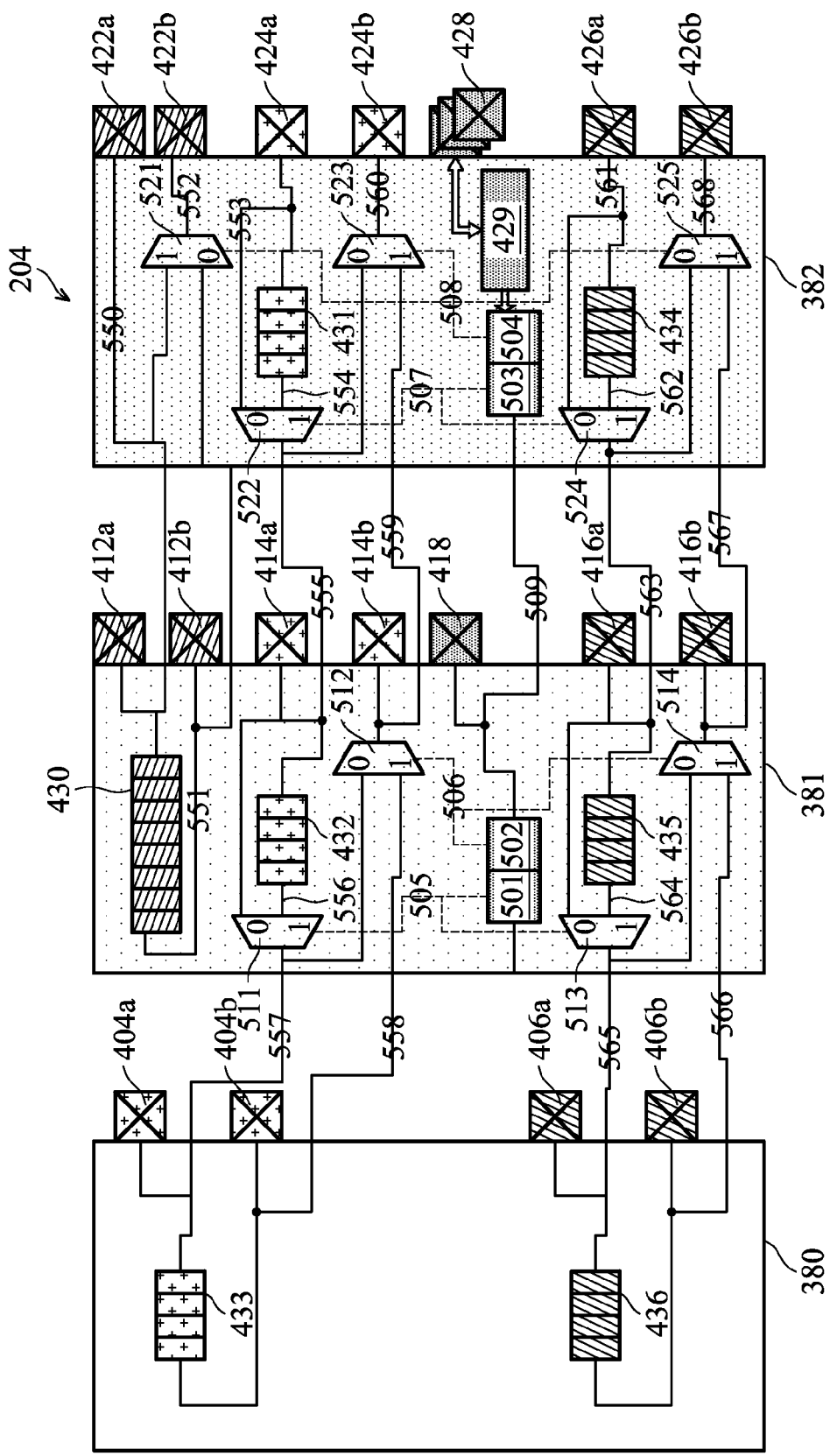

The test control elements, 501, 502, 503 and 504, set up the multiplexers such that scan testing of the stacked IC 114 (design 204) may be conducted layer-by-layer. This point will be illustrated in more details in a later section of the present disclosure. In addition, in the present embodiment as shown in FIG. 5, the test control elements, 501, 502, 503 and 504, are implemented as a chain of serial shift registers controlled through IO pad 428. In another embodiment, as shown in FIG. 6, test control elements 428 and 429 are implemented as IO pads at the second upper layer 382, while test control elements 501 and 502 are implemented as serial shift registers which are at least controlled through IO pad 418 at the first upper layer 381 and may be also controlled through IO pad 429 at the second upper layer 382. A plurality of test control elements may be implemented as a combination of serial shift registers and IO pads. In yet another embodiment, as shown in FIG. 7, test control elements 503 and 504 are implemented in the second upper layer 382 as storage elements, such as registers, programmed through a programmable interface 428, such as an IEEE1149.1 interface or an IEEE1500 interface. In another embodiment, an output of the test control element 501 may be fed back to the second upper layer 382 and may be connected to another IO pad. This may be used for monitoring values of the test control elements 501-504.

Referring again to FIG. 2, although illustrated as separate operations in the present embodiment, operations 212 and 214 may be combined in another embodiment. Moreover, operations 212 and 214 may be performed in different orders and additional operation(s) may be performed before, after or between operations 212 and 214 in other embodiments.

After having produced the design 204, the KGL test method 200 (FIG. 2) proceeds to operation 216 where KGL test patterns are generated. The KGL test patterns are generated on a layer-by-layer basis which is illustrated in FIG. 8 in conjunction with FIGS. 9A-9H.

Figure 8:
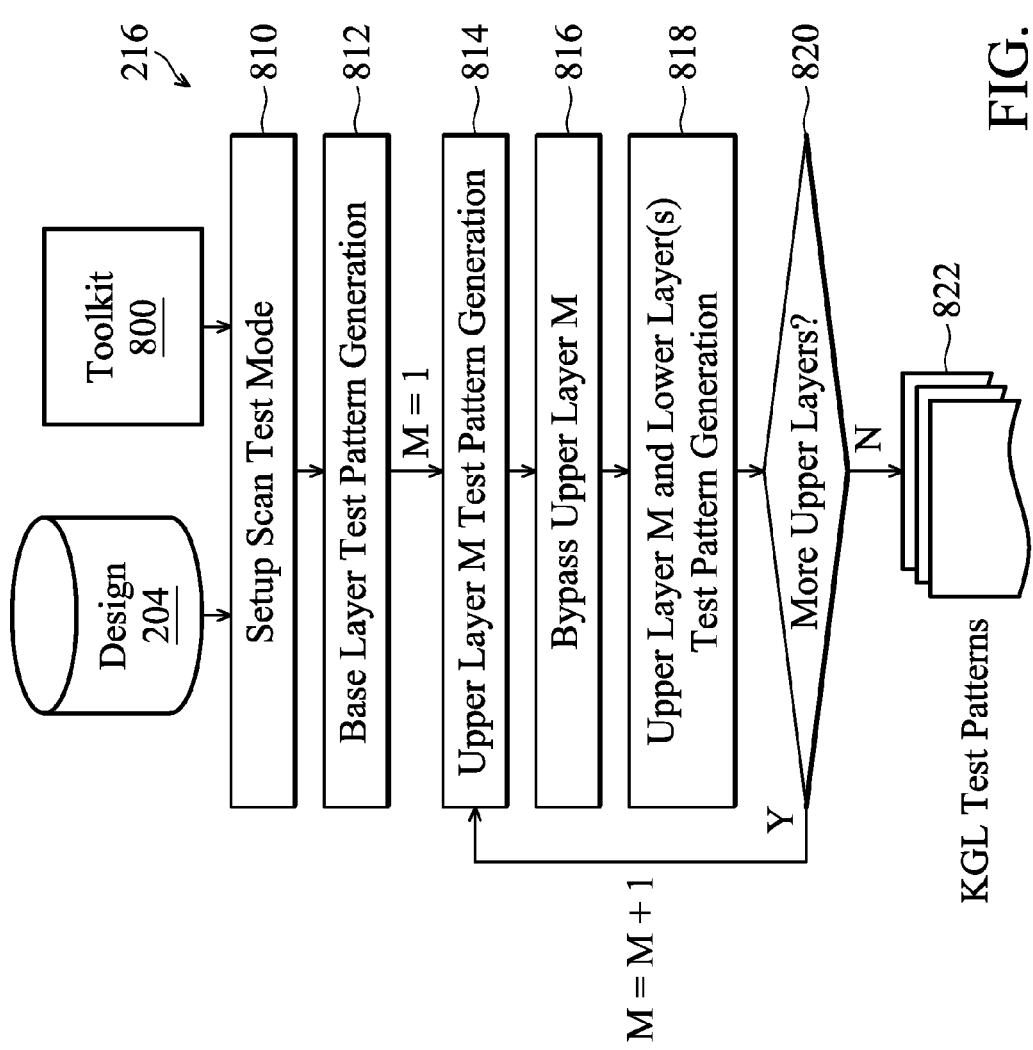
FIG. 8 illustrates a monolithic stacked IC test pattern generation flow according to various aspects of the present disclosure.

Referring to FIG. 8, an embodiment of KGL test pattern generation flow 216 begins with operation 810 where the design 204 is set into a test mode suitable for scan testing, so-called scan test mode. In an embodiment, operation 810 includes setting up the design 204 into scan test mode through input pads. In another embodiment, operation 810 includes setting up the design 204 into scan test mode through a programmable interface, such as an IEEE 1149.1 interface or an IEEE 1500 interface.

Figure 9A:
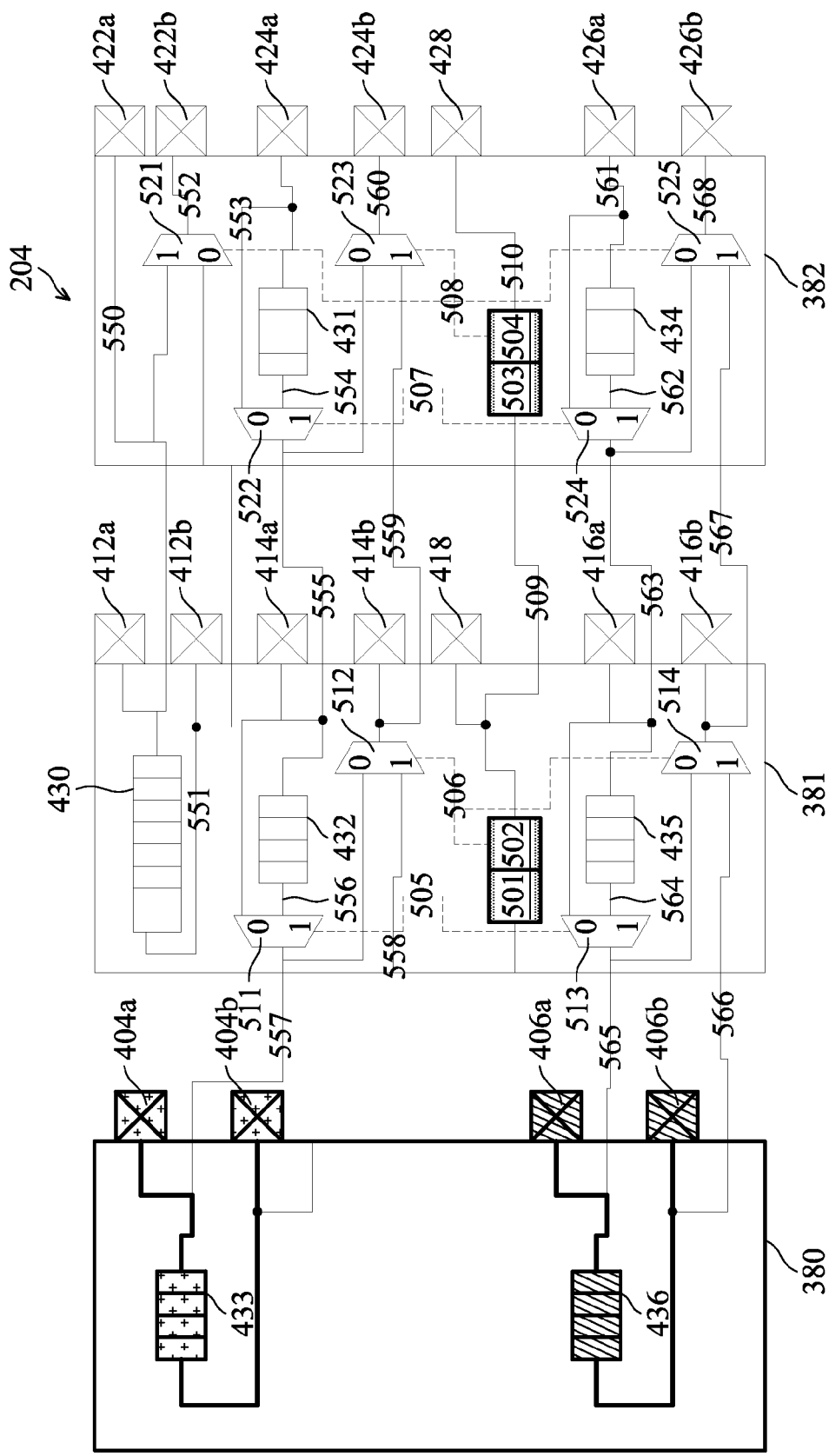
FIGS. 9A-9H illustrate a monolithic stacked IC configurations during a layer-by-layer test pattern generation flow according to various aspects of the present disclosure.

The KGL test pattern generation flow 216 (FIG. 8) proceeds to operation 812 where test patterns for the base layer 380 are generated using IO pads at the base layer 380. Referring to FIG. 9A, a scan chain is formed between IO pads 404a and 404b that includes scan flip-flops 433, and another scan chain is formed between IO pads 406a and 406b that includes scan flip-flops 436. With the design 204 thus configured, the test patterns for detecting faults at the base layer 380 are generated by a toolkit 800, such as a commercially available ATPG tool. Layers 381 and 382 (FIG. 9A) are ignored during operation 812 (FIG. 8) because they may not even exist when the base layer 380 is being tested during fabrication of the IC device 114 (design 204). In an embodiment, input signals coming to the base layer 380 from upper layers are treated as unknowns in operation 812 and are not observed at the scan outputs 404b and 406b. In an embodiment, input signals coming to the base layer 380 from upper layers are assigned fixed logic values using a scan mode multiplexing method to increase fault coverage of the base layer 380.

Figure 9B:
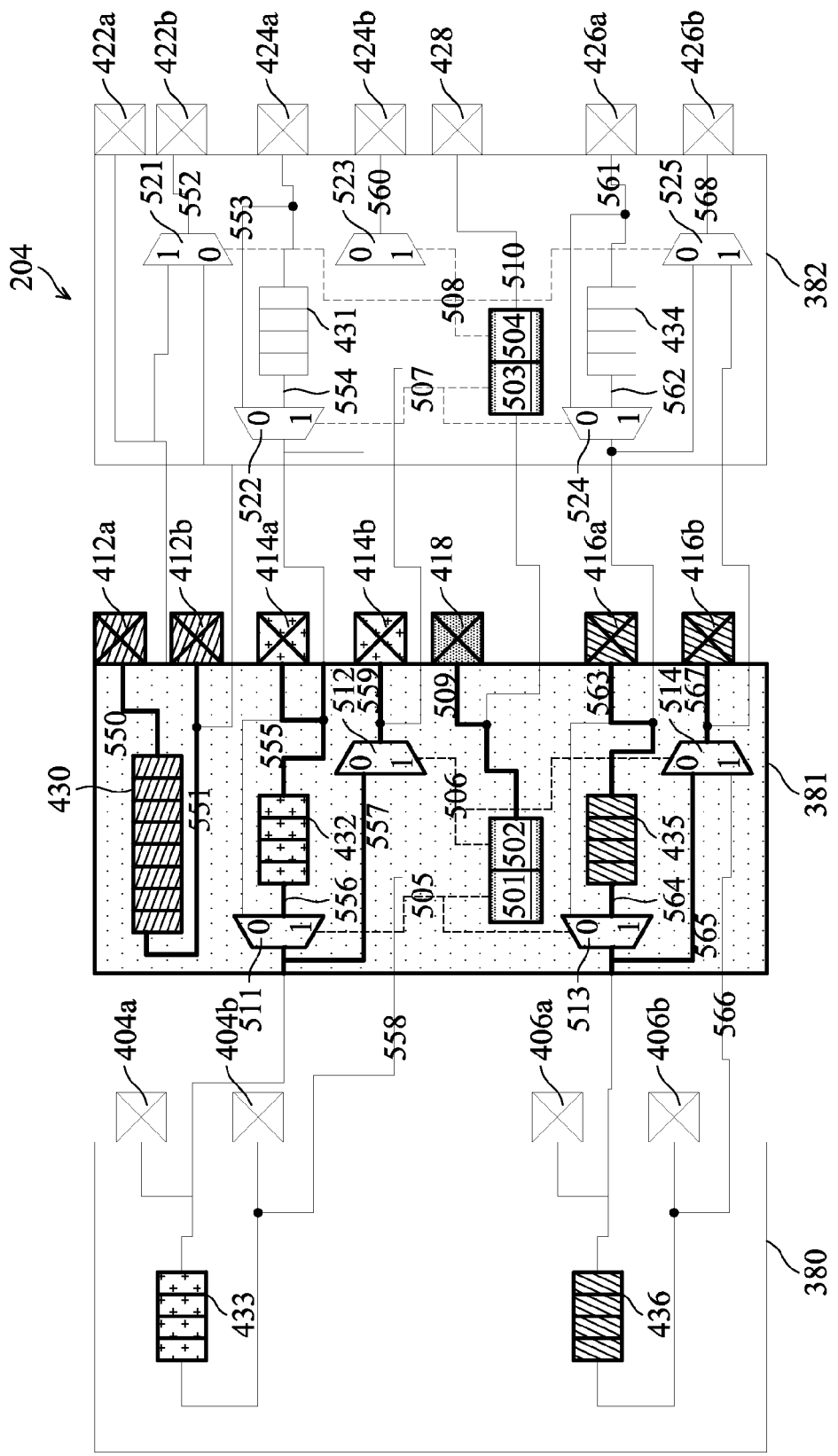

The KGL test pattern generation flow 216 (FIG. 8) proceeds to operation 814 to generate test patterns for the first upper layer 381 using IO pads at the first upper layer 381. IO pads at the base layer 380 may not be accessible once the first upper layer 381 is formed over the base layer 380 during fabrication of the IC device 114 (design 204). Referring to FIG. 9B, the test control elements, 501 and 502 are set to a value "1" and a value "0" respectively through a test IO pad 418. With this configuration, a first scan chain is formed between IO pads 412a and 412b, a second scan chain is formed between IO pads 414a and 414b, and a third scan chain is formed between IO pads 416a and 416b. The layers 380 and 382 are ignored.

Referring again to FIG. 9B, a scan shift operation for the scan chain 412a/412b is as follows: data goes from scan input 412a to an input of scan flip-flops 430 via node 550, and from an output of scan flip-flops 430 to scan output 412b via node 551.

Referring again to FIG. 9B, a scan shift operation for the scan chain 414a/414b is as follows: data goes from scan input 414a to an input of flip-flops 432 via node 555, from an output of flip-flops 432 to an input of multiplexer 511 via node 556, from an output of multiplexer 511 to an input of multiplexer 512 via node 557, and from an output of multiplexer 512 to scan output 414b via node 559. A scan shift operation for the scan chain 416a/416b can be analyzed similarly.

Operation 814 executes the toolkit 800 to generate test patterns for detecting faults with the design 204 thus configured (FIG. 9B).

Figure 9C:
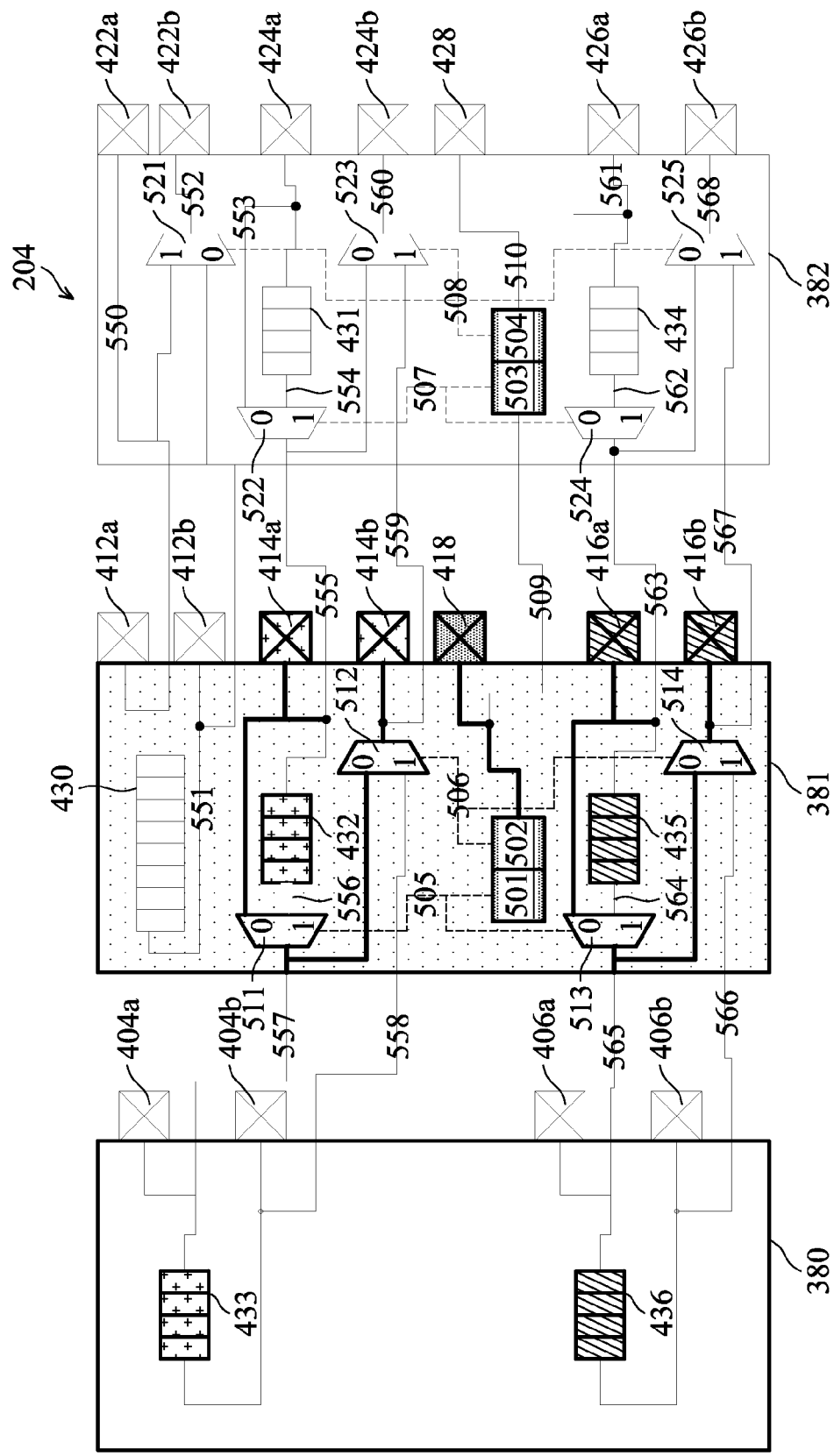

The KGL test pattern generation flow 216 (FIG. 8) proceeds to operation 816 to bypass the scan flip-flops, 430, 432 and 435, at the first upper layer 381. Referring to FIG. 9C, the test control elements 501 and 502 are set to a value "0" and a value "0" respectively through the test IO pad 418. With this configuration, scan shift data goes from scan inputs, 414a and 416a, to respective scan outputs, 414b and 416b, without going through scan flip-flops at the first upper layer 381. Scan chain 412a/412b is ignored for this operation because it does not have associated bypass multiplexers. The toolkit 800 is again executed to generate test patterns for detecting faults with the design 204 thus configured (FIG. 9C).

Figure 9D:
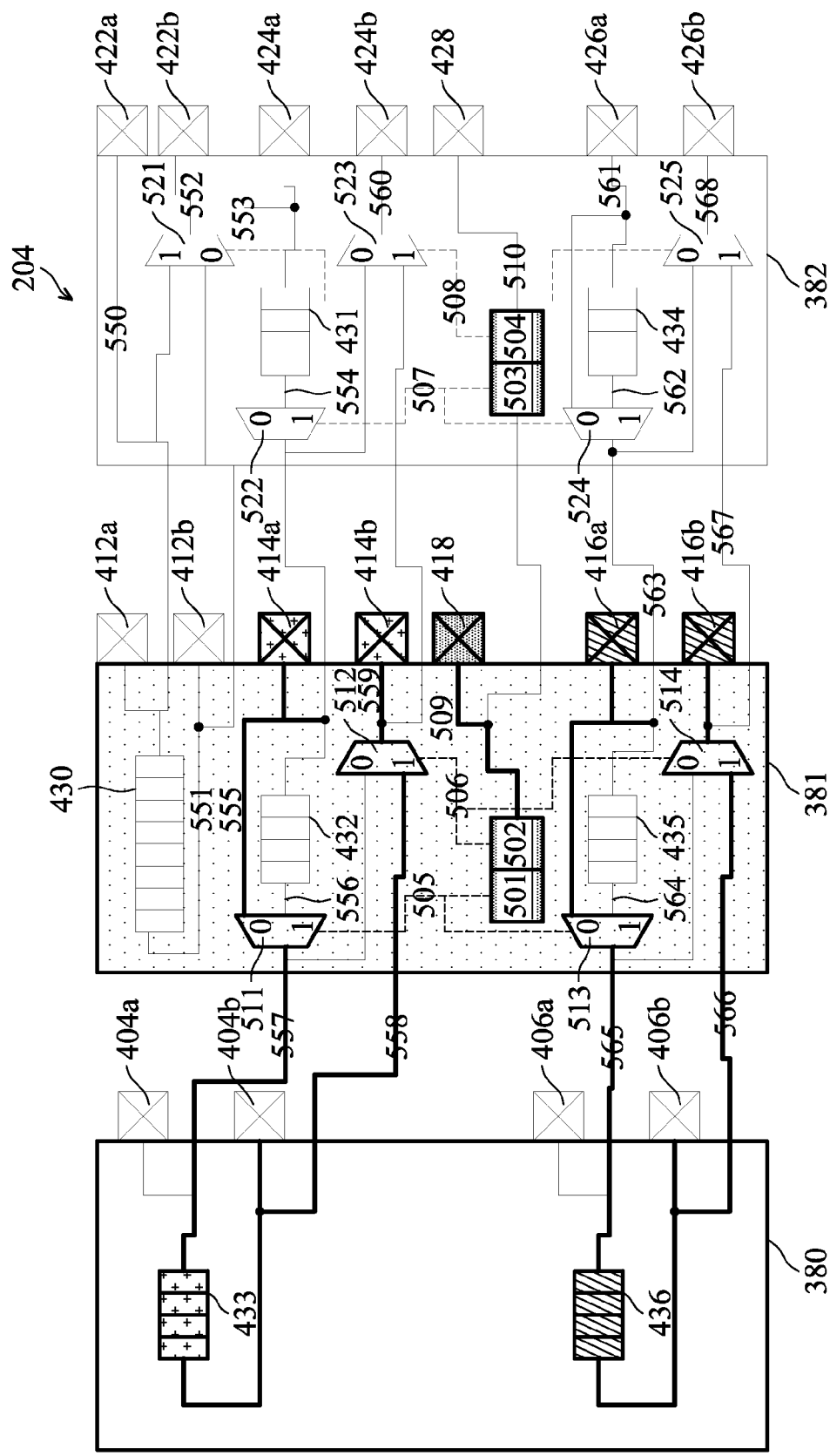

The KGL test pattern generation flow 216 (FIG. 8) proceeds to operation 818 where test patterns for both the layers 381 and 380 are generated using IO pads at the first upper layer 381. Referring to FIG. 9D, the test control elements 501 and 502 are set to a value "0" and a value "1" respectively through the test IO pad 418. With this configuration, scan shift data from IO pads 414a and 416a go through both the layers 381 and 380 before returning back to IO pads 414b and 416b respectively.

Referring again to FIG. 9D, a scan shift operation for the scan chain 414a/414b is as follows: data goes from scan input 414a to an input of multiplexer 511 via node 555, from an output of multiplexer 511 to an input of scan flip-flops 433 via node 557, from an output of scan flip-flops 433 to an input of multiplexer 512 via node 558, and from an output of multiplexer 512 to scan output 414b via node 559. A scan shift operation for the scan chain 416a/416b can be analyzed similarly.

The toolkit 800 is again executed to generate test patterns for detecting faults with the design 204 thus configured (FIG. 9D).

In an embodiment, operation 818 sets the test control elements 501 and 502 to a value "1" and a value "1" respectively. With this configuration, scan shift data go through the first upper layer 381 and the base layer 380, including scan flip-flops 432, 433, 435 and 436. Test patterns may be generated with the design 204 thus configured.

The KGL test pattern generation flow 216 (FIG. 8) proceeds to operation 820. If there is no more upper layer for fault testing, the KGL test generation flow 216 terminates and stores test patterns thus far generated into a data file 822. If there are more upper layers for fault testing, as is the case for the layer 382 in the present embodiment, the KGL test pattern generation flow 216 proceeds to operation 814 to generate test patterns for the second upper layer 382 using IO pads at the second upper layer 382. IO pads at the layers 381 and 380 may not be accessible once the second upper layer 382 is formed over the first upper layer 381 during fabrication of the IC device 114 (design 204).

Figure 9E:
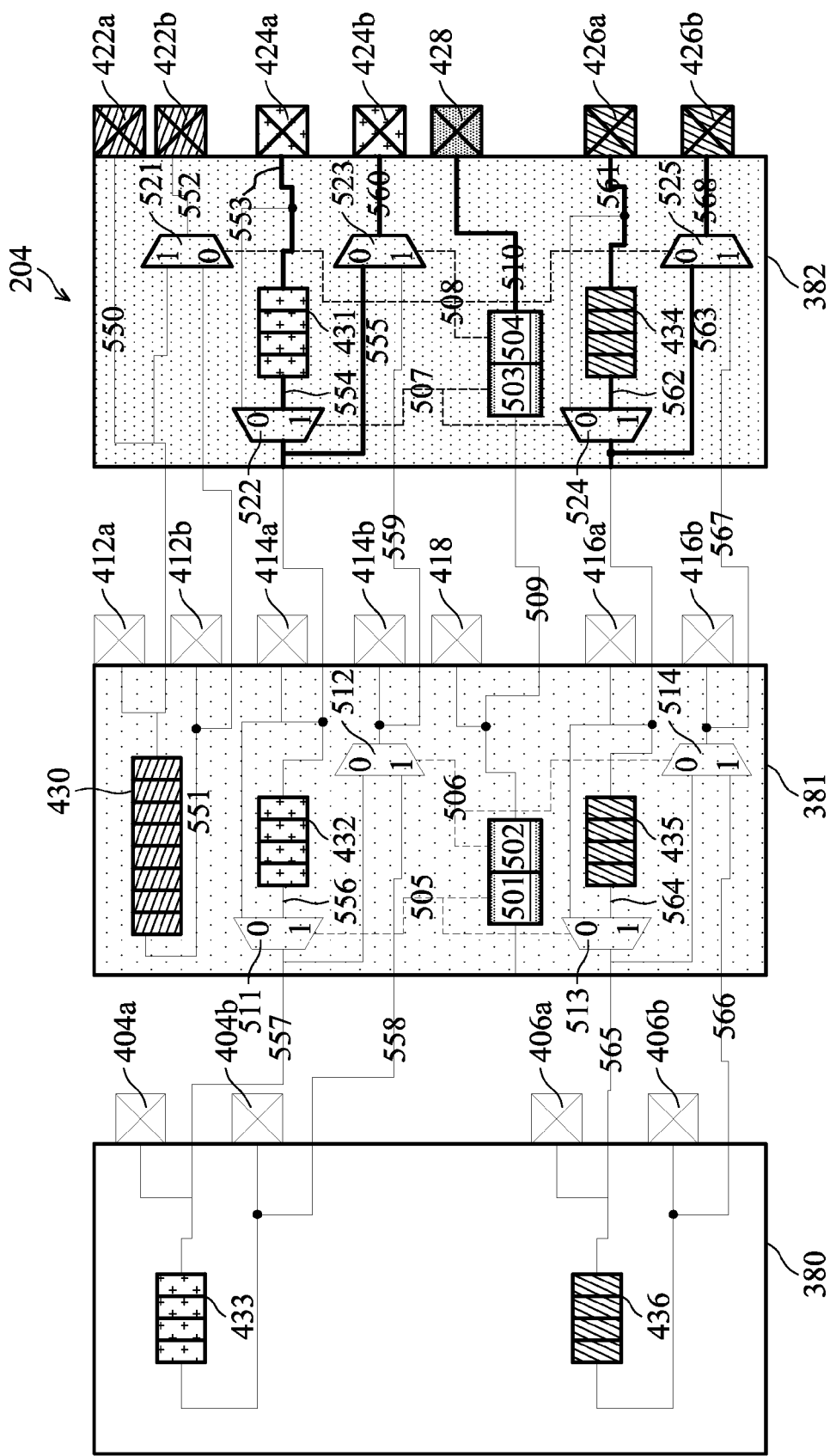

Referring to FIG. 9E, operation 814 sets the test control elements, 503 and 504, to a value "1" and a value "0" respectively through IO pad 428. With this configuration, a first scan chain is formed between IO pads 424a and 424b, and a second scan chain is formed between IO pads 426a and 426b. IO pads 422a and 422b are ignored because there are no scan flip-flops between them at the layer 382. The layers 380 and 382 are also ignored.

Referring again to FIG. 9E, a scan shift operation for the scan chain 424a/424b is as follows: data goes from scan input 424a to an input of flip-flops 431 via node 553, from an output of flip-flops 431 to an input of multiplexer 522 via node 554, from an output of multiplexer 522 to an input of multiplexer 523 via node 555, and from an output of multiplexer 523 to scan output 424b via node 560. A scan shift operation for the scan chain 426a/426b can be analyzed similarly.

Operation 814 again executes the toolkit 800 to generate test patterns for detecting faults with the design 204 thus configured (FIG. 9E).

Figure 9F:
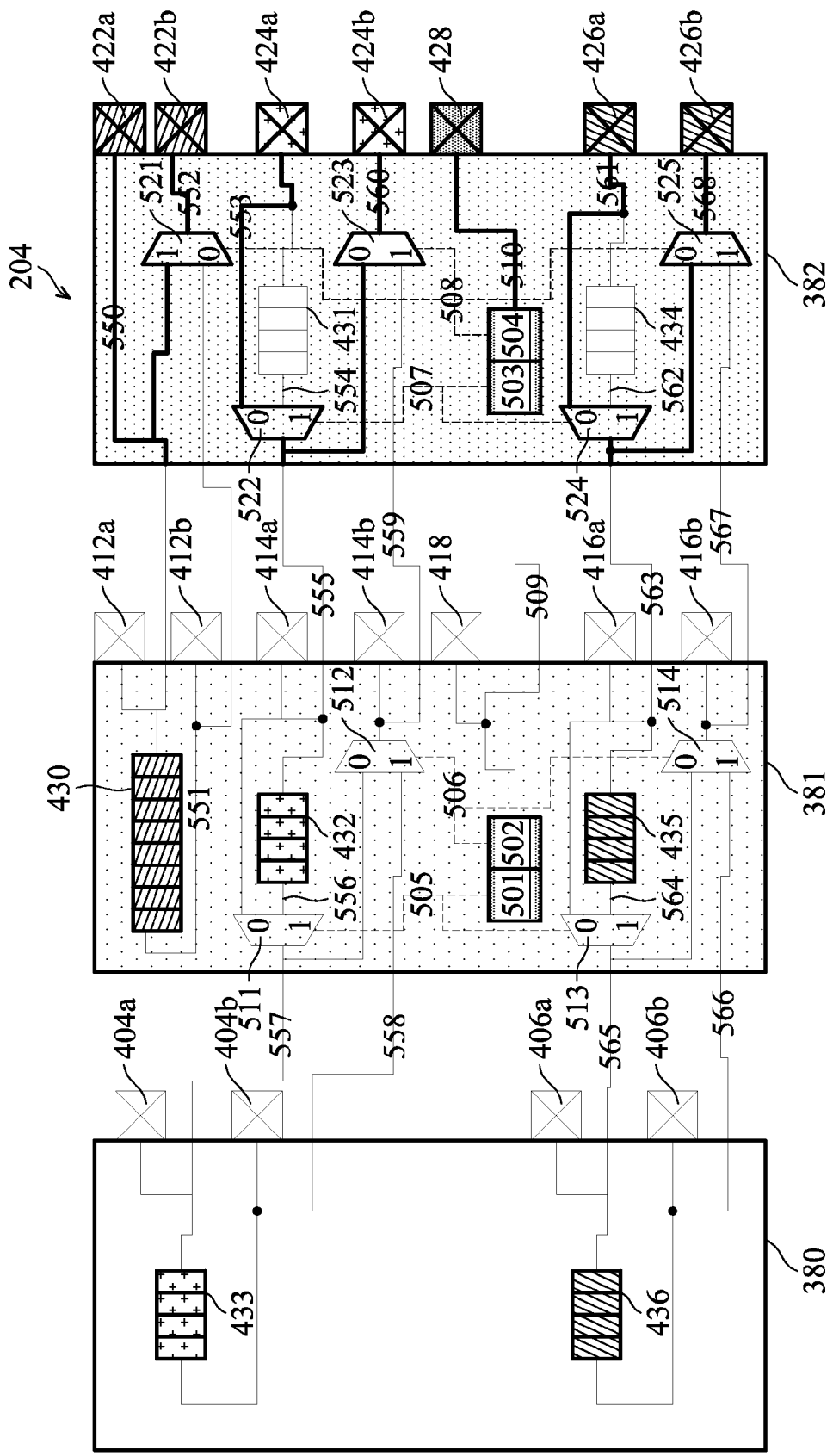

The KGL test pattern generation flow 216 (FIG. 8) proceeds to operation 816 to bypass the scan flip-flops, 431 and 434, at the second upper layer 382. Referring to FIG. 9F, the test control elements 503 and 504 are set to a value "0" and a value "0" respectively through IO pad 428. With this configuration, scan shift data goes from scan inputs, 422a, 424a and 426a, to respective scan outputs, 422b, 424b and 426b, without going through scan flip-flops at the second upper layer 382. The toolkit 800 is again executed to generate test patterns for detecting faults with the design 204 thus configured (FIG. 9F).

Figure 9G:
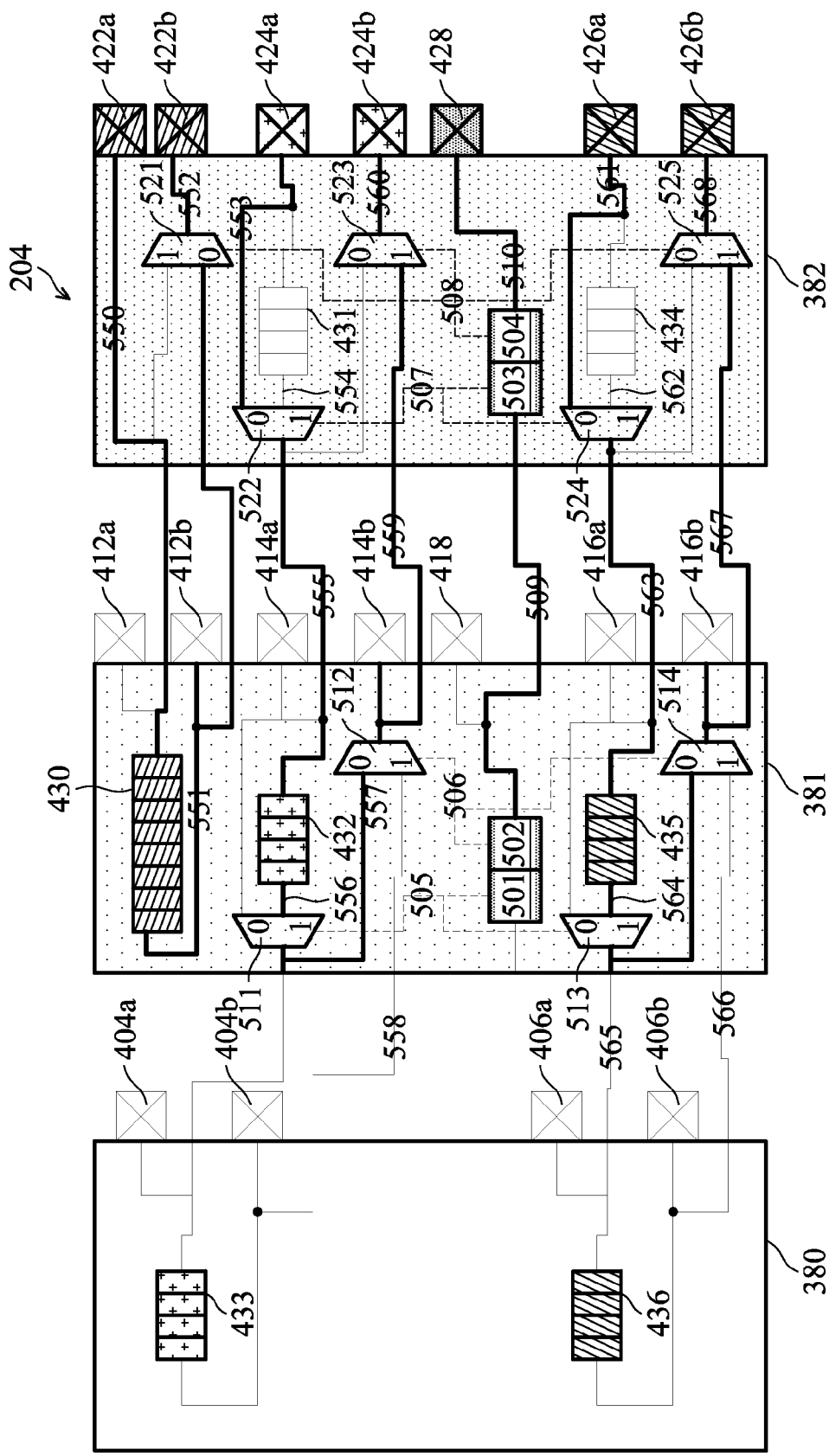

The KGL test pattern generation flow 216 (FIG. 8) proceeds to operation 818 where test patterns for the layers 382, 381 and 380 are generated using IO pads at the second upper layer 382. Referring to FIG. 9G, the test control elements 501, 502, 503 and 504 are set to a value "1," a value "0," a value "0" and a value "1" respectively through IO pad 428. With this configuration, scan shift data from IO pads 422a, 424a and 426a go through both the layers 382 and 381 before returning back to IO pads 422b, 424b and 426b respectively.

Referring again to FIG. 9G, a scan shift operation for the scan chain 424a/424b is as follows: data goes from scan input 424a to an input of multiplexer 522 via node 553, from an output of multiplexer 522 to an input of scan flip-flops 432 via node 555, from an output of scan flip-flops 432 to an input of multiplexer 511 via node 556, from an output of multiplexer 511 to an input of multiplexer 512 via node 557, from an output of multiplexer 512 to an input of multiplexer 523 via node 559, and from an output of multiplexer 523 to scan output 424b via node 560. A scan shift operation for the scan chains 422a/422b and 426a/426b can be analyzed similarly.

The toolkit 800 is again executed to generate test patterns for detecting faults with the design 204 thus configured (FIG. 9G).

Figure 9H:
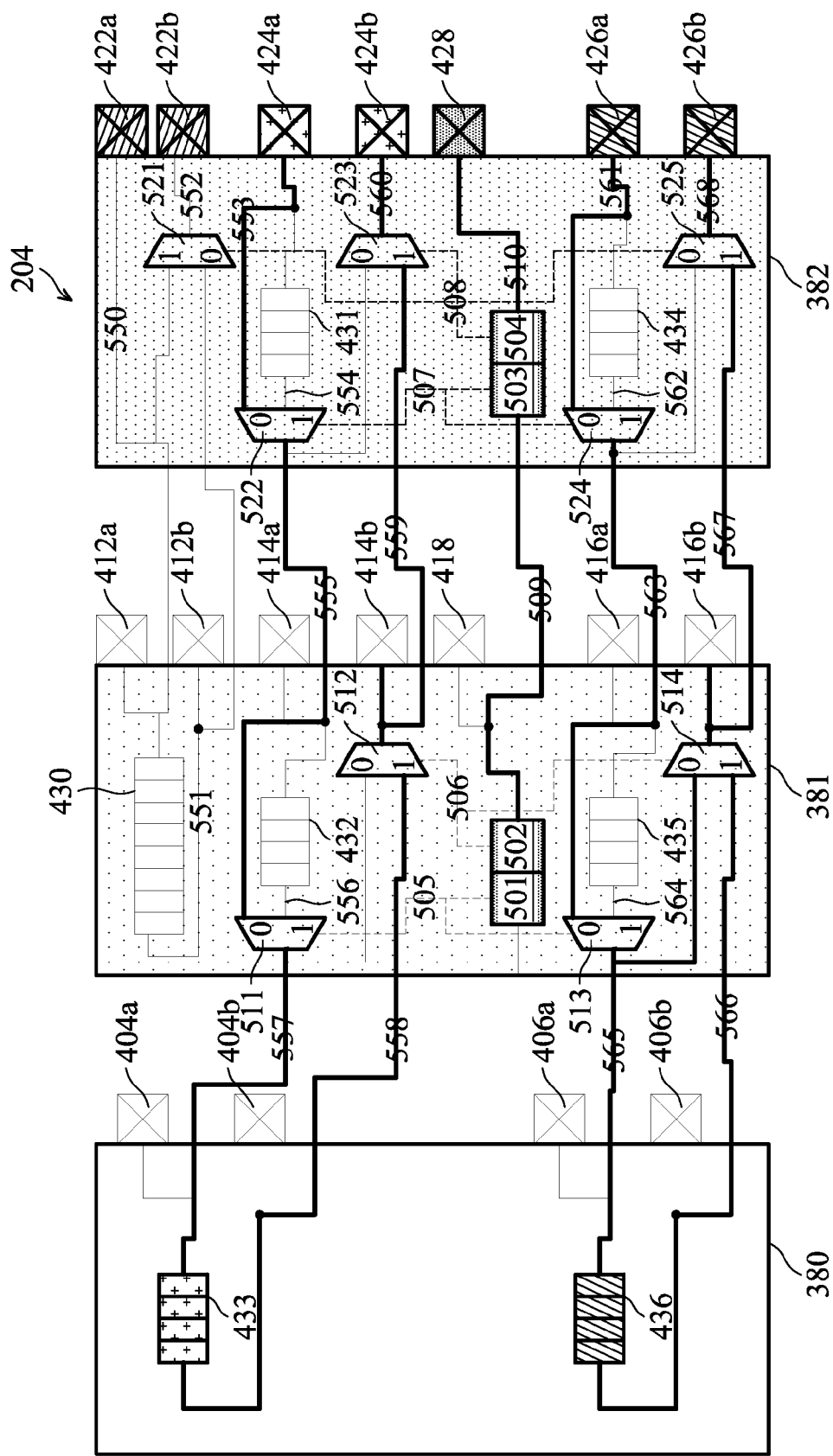

Operation 818 may set the test control elements 501, 502, 503 and 504 to other combinations of values through IO pad 428 so as to achieve desirable test coverage for the layers 382, 381 and 380. To this regard, FIG. 9H illustrates another configuration set by operation 818. Referring to FIG. 9H, the test control elements 501, 502, 503 and 504 are set to a value "0," a value "1," a value "0" and a value "1" respectively. With this configuration, scan chain 424a/424b (426a/426b) includes scan flip-flops 433 (436) for testing the base layer 380 from the second upper layer 382.

Figure 10:
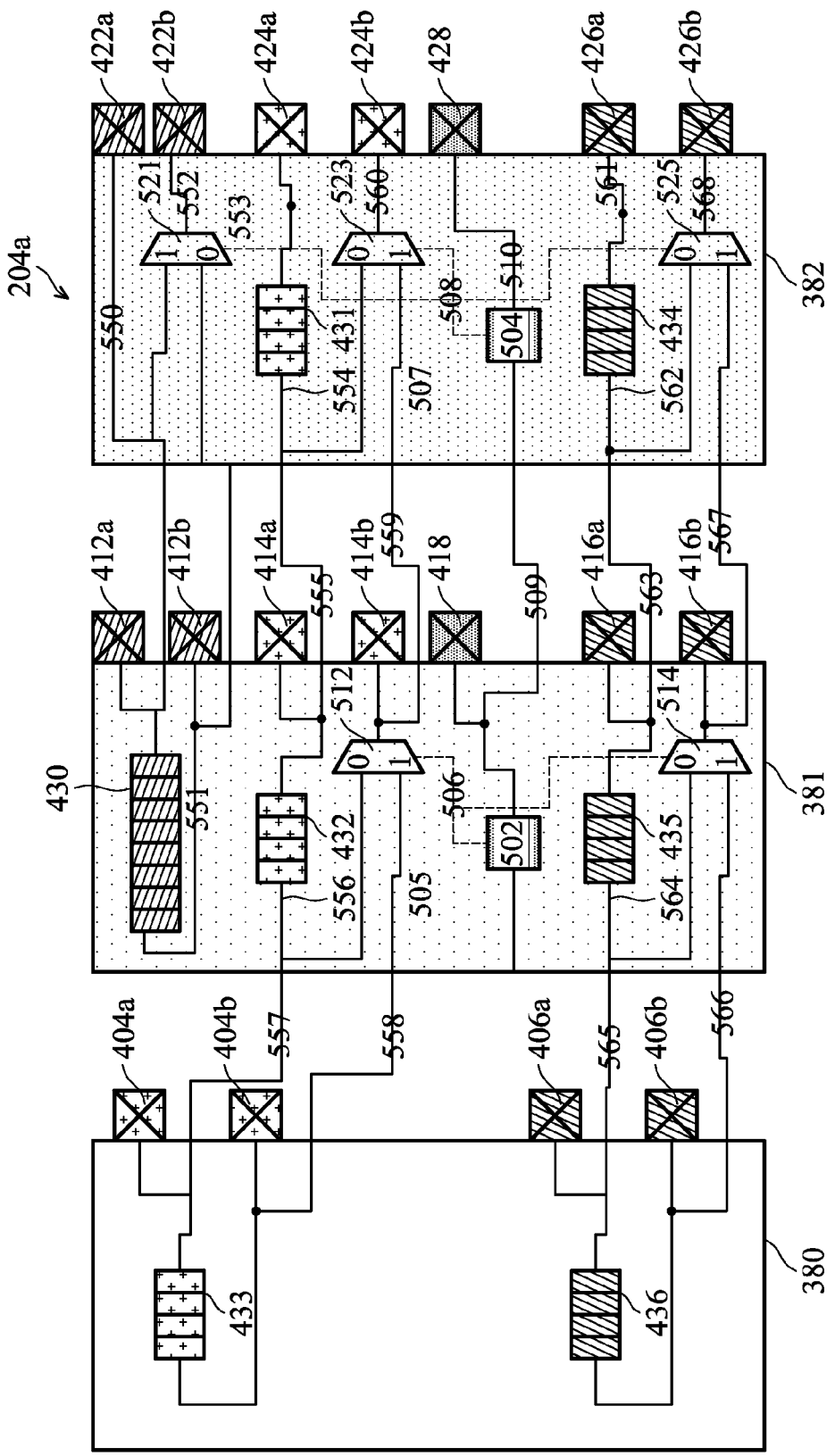
FIGS. 10 and 11 illustrate embodiments of scan test architecture in a monolithic stacked IC design according to various aspects of the present disclosure.
Figure 11:
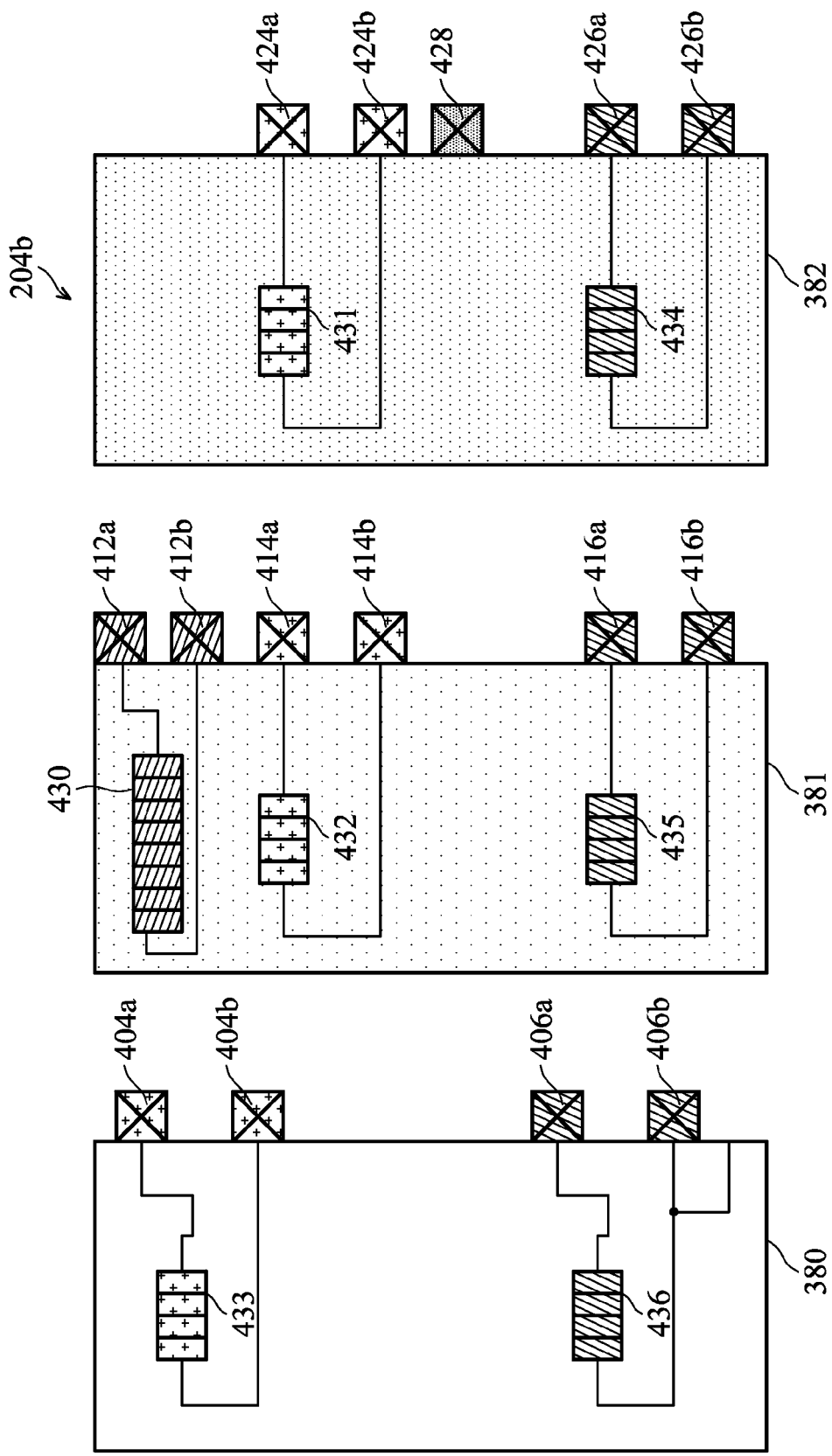

Thus far illustrated is a layer-by-layer KGL test pattern generation flow for the monolithic stacked IC 114 at circuit design phase 106 (FIG. 1) with an embodiment of KGL scan test architecture as shown in FIG. 5. FIG. 10 illustrates another embodiment of KGL scan test architecture where scan-in bypass multiplexers are degenerated. Referring to FIG. 10, a design 204a may be viewed as a derivative of the design 204 (FIG. 5) wherein the control elements 501 and 503 in the design 204 are each fixed to a value of "1" thereby the control elements 501 and 503 and the multiplexers 511, 513, 522 and 524 are degenerated. FIG. 11 illustrates yet another embodiment of KGL scan test architecture where both scan-in bypass multiplexers and scan-out bypass multiplexers are degenerated. Referring to FIG. 11, a design 204b may be viewed as a derivative of the design 204 (FIG. 5) wherein the control elements 501, 502, 503 and 504 in the design 204 are fixed to a value of "1," a value of "0," a value of "1" and a value of "0" respectively and thereby the control elements 501, 502, 503 and 504 and the multiplexers 511, 512, 513, 514, 522, 523, 524 and 525 are degenerated. The principles of the KGL test pattern generation flow with reference to FIG. 8 are applicable to both the designs 204a and 204b.

When the monolithic stacked IC 114 is fabricated at phase 112 (FIG. 1), test patterns, such as the test patterns stored in the data file 822 (FIG. 8), are applied for detecting manufacture faults of the IC 114 as each layer is fabricated. This is illustrated in FIG. 12 in conjunction with FIGS. 13A-13E.

Figure 12:
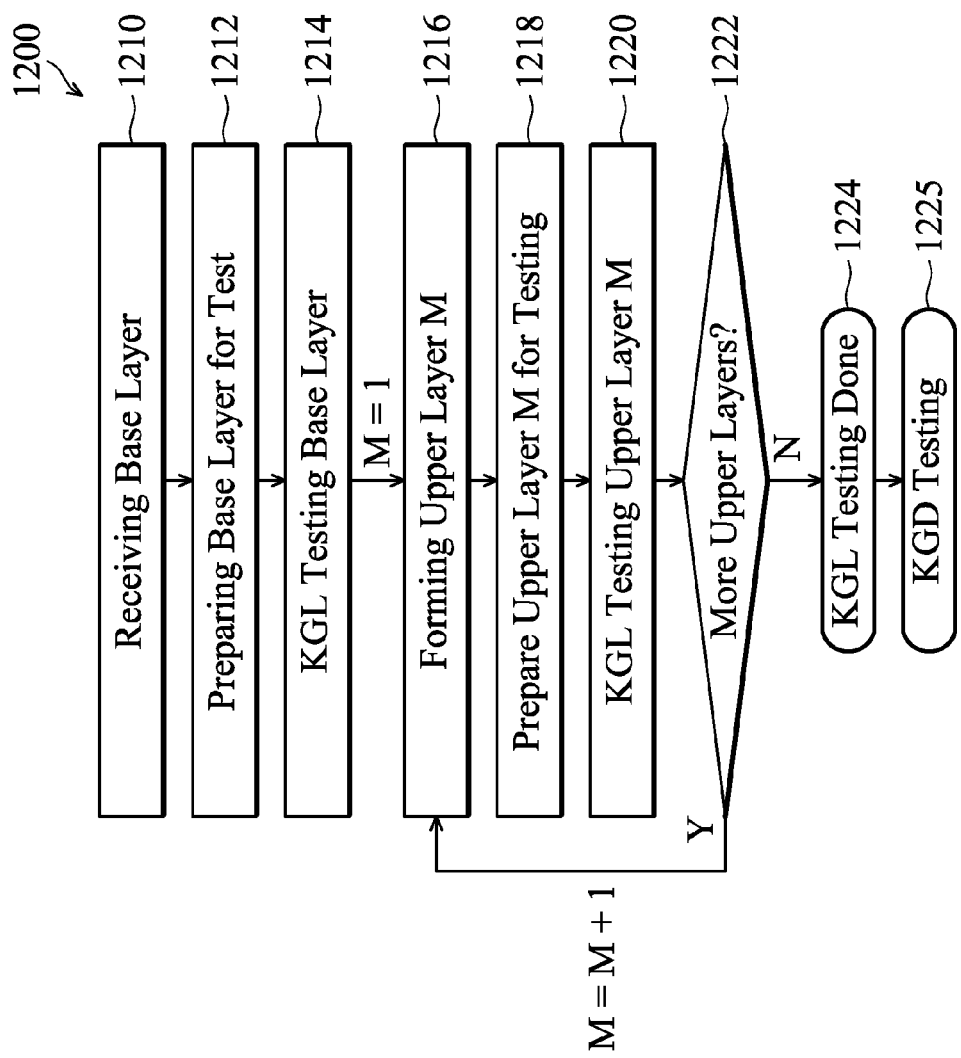
FIG. 12 illustrates a monolithic stacked IC manufacture fault testing flow according to various aspects of the present disclosure.
Figure 13A:
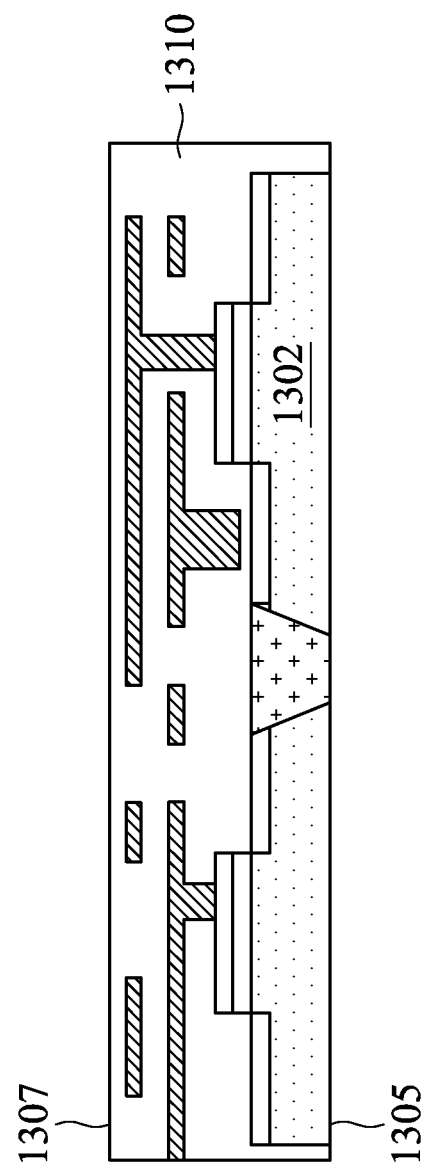
FIGS. 13A-13E show an embodiment of monolithic stacked IC manufacture fault test application flow according to various aspects of the present disclosure.

Referring to FIG. 12, an embodiment of a monolithic stacked IC manufacture fault testing flow 1200 is shown. The testing flow 1200 begins with operation 1210 where a wafer is processed to include a base layer. FIG. 13A shows one exemplar base layer 1310 for the IC 114. The base layer 1310 includes a substrate 1302. The base layer is defined to have two surfaces 1305 and 1307. In the present embodiment, the surface 1305 is at an active region side of the base layer and the surface 1307 is at a metal side of the base layer. In an embodiment, the substrate 1302 is a silicon substrate. In an embodiment the base layer 1310 includes through-silicon vias (TSVs).

Figure 13B:
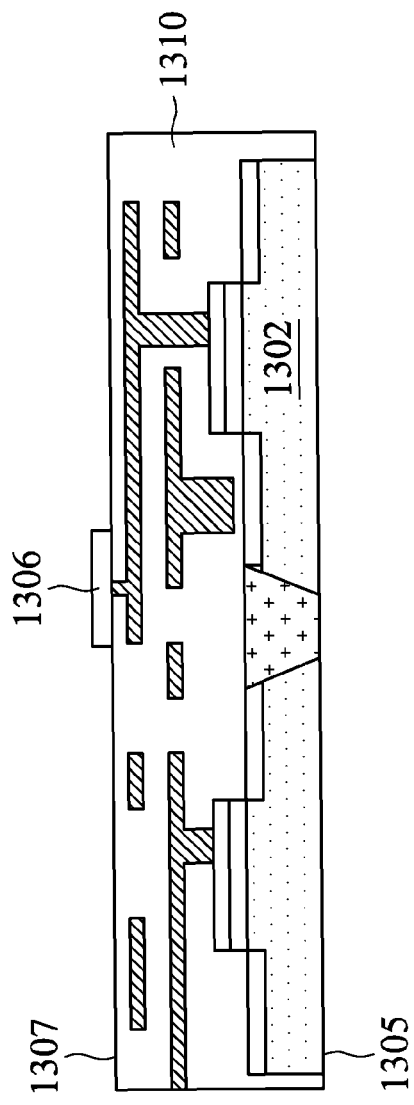

After receiving the base layer 1310, the testing flow 1200 (FIG. 12) proceeds to operation 1212 for preparing the base layer 1310 for fault testing. Referring to FIG. 13B, a probe pad 1306 is attached to the surface 1307 and electrically contacts the base layer 1310 through the surface 1307. Other probe pads suitable for fault testing of the base layer 1310 are similarly attached, such as IO pads 404a, 404b, 406a and 406b shown in FIG. 9A.

The testing flow 1200 (FIG. 12) proceeds to operation 1214 for applying test patterns to the base layer. The test patterns have been generated according to one or more embodiments of the KGL test pattern generation flow 216 as shown in FIG. 8 with scan configurations such as shown in FIG. 9A. If defects are found with the base layer 1310, some dispositions may be taken. For example, the IC 114 may be marked bad on the wafer map and discarded for further fabrication and processes. For example, the base layer 1310 may be repaired to fix the defects.

Figure 13C:
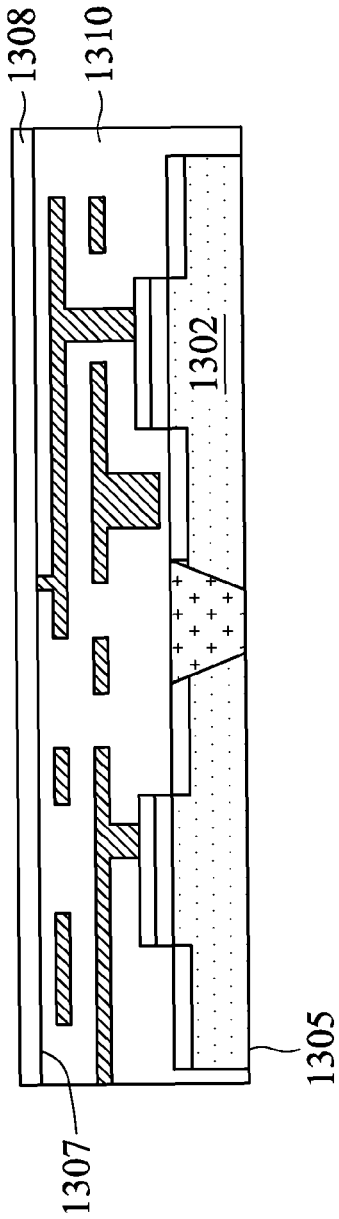
Figure 13D:
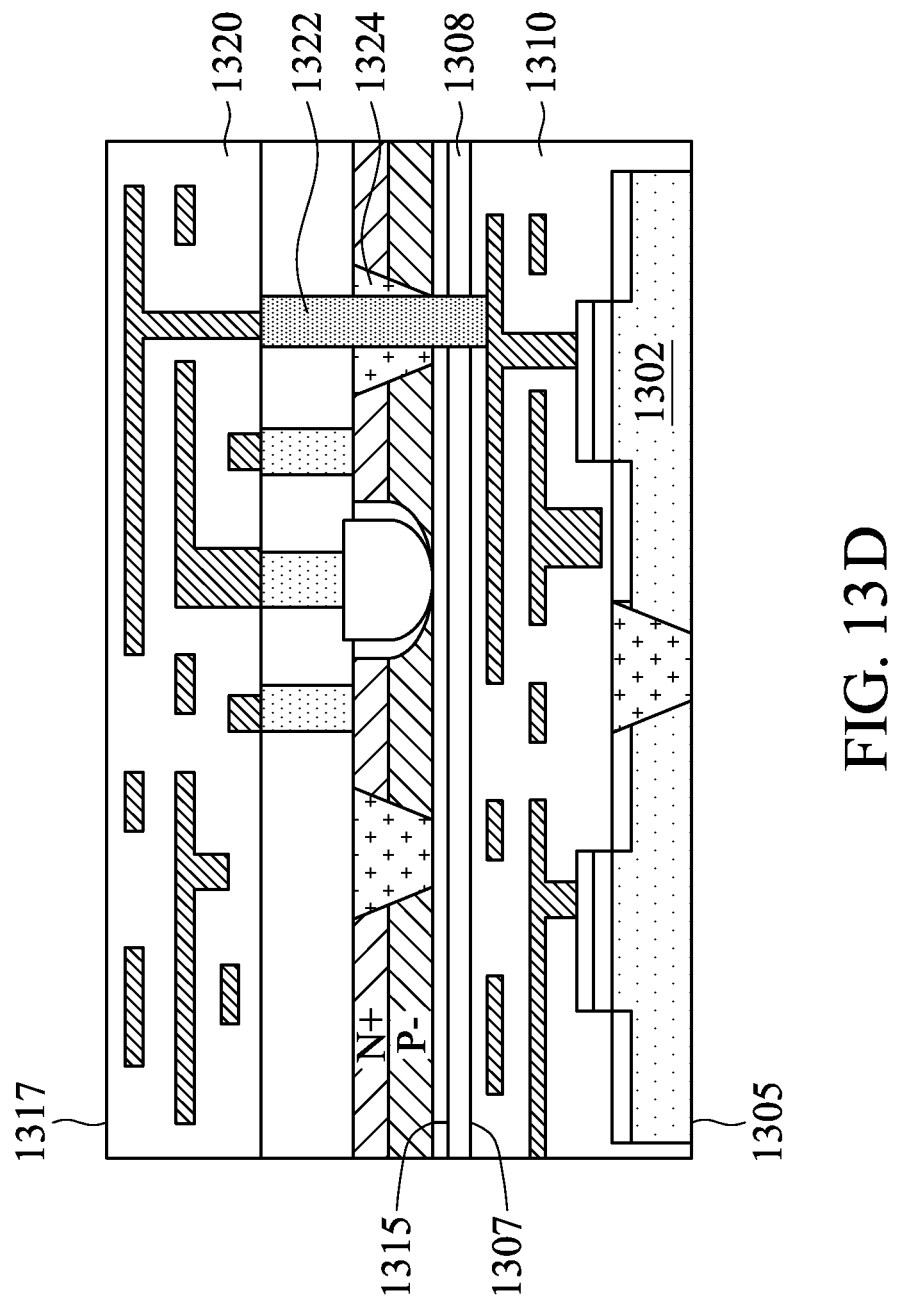
Figure 13:
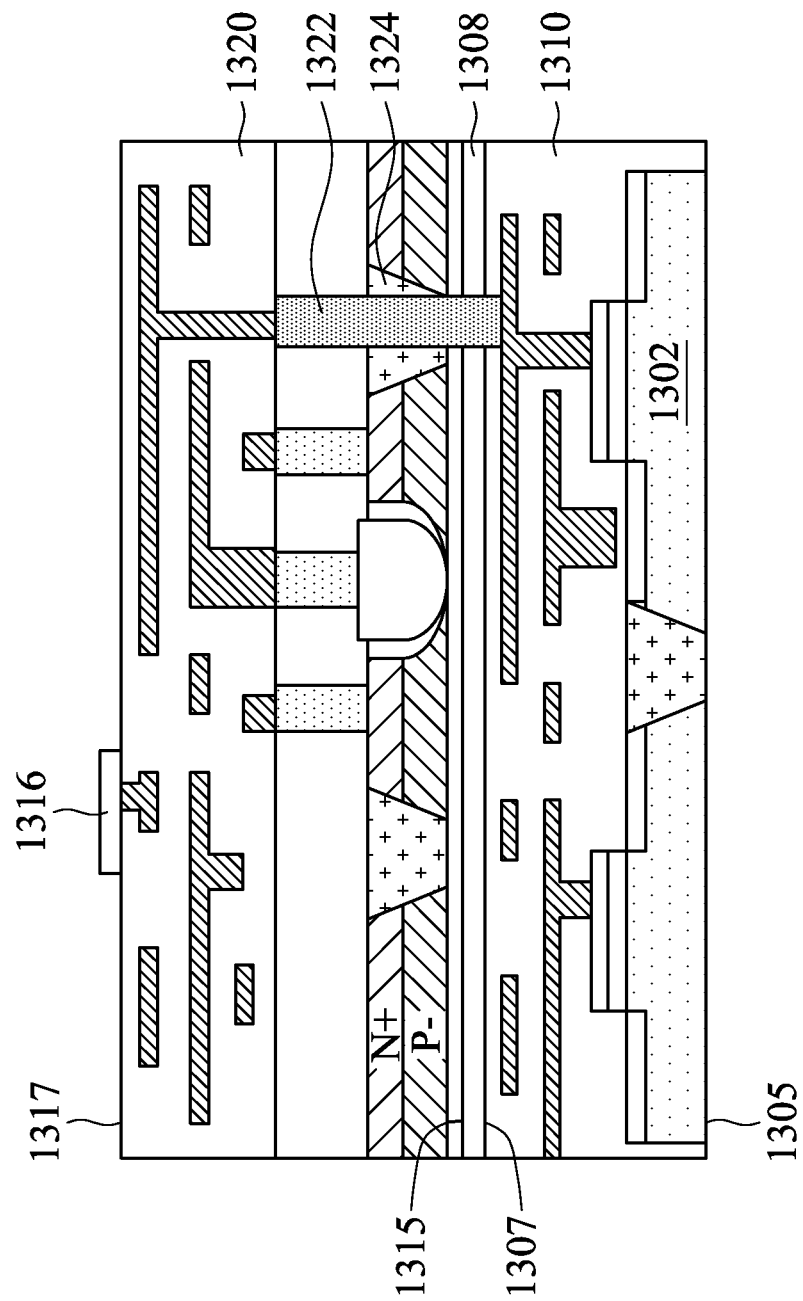

Once the base layer 1310 is satisfactory for further IC fabrication, the testing flow 1200 (FIG. 12) proceeds to operation 1216 for forming an upper layer over the base layer. This is illustrated in FIGS. 13C and 13D. FIG. 13C shows that an insulation layer 1308 is formed over the surface 1307. In an embodiment, the probe pads for testing the base layer 1310, such as the probe pad 1306, are removed (or detached) before the insulation layer 1308 is formed. The insulation layer 1308 may be formed by a process of depositing a dielectric material layer, such as oxide, over the surface 1307 and performing a chemical-mechanical polishing (CMP) to the dielectric material layer. FIG. 13D shows that an upper layer 1320 is formed over the insulation layer 1308 and electrically contacts the base layer 1310 with a conducting feature 1322 and a through-layer via 1324. In the present embodiment, as shown in FIG. 13D, the upper layer 1320 has two surfaces 1315 (active region side) and 1317 (metal region side), with the surface 1315 directly over the insulation layer 1308.

Forming the upper layer 1320 may be done by a variety of processes. In an embodiment, a process of forming the upper layer 1320 starts with receiving a new wafer (a donor wafer), constructing dopant regions in a top layer of the new wafer and activating the dopant regions at a high temperature, such as about 1000 degree Celsius. The process further includes implanting hydrogen into the dopant regions for cutting the dopant regions at a later step, bonding the new wafer to the base layer 1310 (including the insulation layer 1308) with the dopant regions directly over the base layer 1310 and performing an ion cut process to the new wafer thereby leaving a thin layer of dopant regions over the base layer 1310. The process further includes forming shallow trench isolations (STI) in the thin layer of dopant regions for defining isolation regions for through-layer vias and for defining active regions for devices, such as recess channel array transistors (RCATs). In an embodiment, forming STI regions includes etching shallow trenches in the dopant regions, depositing a dielectric material layer, such as oxide, into the shallow trenches and over the dopant regions and performing a chemical-mechanical polishing (CMP) process to the dielectric material layer. The process of forming the upper layer 1320 further includes etching gate regions within the active regions defined by the STI regions, forming gate oxide and forming gate electrode. The process further includes forming interconnect structures within the upper layer 1320 as well as between the upper layer 1320 and the base layer 1310. In an embodiment, a process of forming interconnect structures includes forming a dielectric material layer over the STI and active regions of the upper layer 1320, performing a CMP process to the dielectric material layer, etching the dielectric material layer and/or the STI regions to form through-layer vias and/or RCAT contact trenches, depositing conducting materials, such as copper, into the vias and/or trenches and performing another CMP process to the conducting materials.

With the upper layer 1320 thus formed directly over the base layer 1310, The testing flow 1200 (FIG. 12) proceeds to operation 1218 for preparing the base layer 1310 and the upper layer 1320 for fault testing, as shown in FIG. 13E. Referring to FIG. 13E, a probe pad 1316 is attached to the surface 1317 and electrically contacts the upper layer 1320 through the surface 1317. Other probe pads suitable for fault testing of the upper layer 1320 are similarly attached, such as IO pads 412a, 412b, 414a, 414b, 416a and 416b shown in FIG. 9B.

The testing flow 1200 (FIG. 12) proceeds to operation 1220 for applying test patterns to the upper layer 1320 and the base layer 1310. The test patterns have been generated according to one or more embodiments of the KGL test pattern generation flow 216 as shown in FIG. 8 with scan configurations such as shown in FIGS. 9B, 9C, and 9D. If defects are found with the layers, some dispositions may be taken. For example, the IC 114 may be marked bad on the wafer map and discarded for further fabrication and processes. For example, the upper layer 1320 may be repaired to fix the defects.

The testing flow 1200 (FIG. 12) proceeds to operation 1222. If there is no more upper layer to fabricate, the KGL testing flow finishes at operation 1224 and further testing to the completed stacked IC 114 may be performed in operation 1225. For example, a known-good-die (KGD) testing of the IC 114 may be performed to gain higher test coverage as all layers and all connections of the IC 114 are now complete. For example, the IC 114 may be cut out of the wafer, packaged, and tested again with the package.

If there are more upper layers to be fabricated and tested, the testing flow 1200 (FIG. 12) goes back to operation 1216 and the aforementioned process of forming and testing an upper layer of the stacked IC 114 is repeated.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a monolithic stacked integrated circuit (IC) known-good-layer (KGL) test circuit in a first layer of the IC. The IC includes the first layer and a second layer. The first layer is an upper layer of the IC, and the first layer includes a scan segment. The test circuit includes a first test input, coupled to an input of the scan segment, to receive a first scan shift data. The test circuit further includes a first multiplexer. The first multiplexer includes a first data input, a second data input, a first selection input, and a first data output wherein the first data input is coupled to the first test input and the second data input is coupled to an output of the scan segment. The test circuit further includes a first test output, coupled to the first data output, to send a second scan shift data to a second layer. The test circuit further includes a second test input, to receive a third scan shift data from the second layer. The test circuit further includes a second multiplexer. The second multiplexer includes a third data input, a fourth data input, a second selection input, and a second data output wherein the third data input is coupled to the second test input and the fourth data input is coupled to the first data output. The test circuit further includes a second test output, coupled to the second data output, to send a fourth scan shift data. The test circuit further includes a first control element, coupled to the first selection input. The test circuit further includes a second control element, coupled to the second selection input.

In another exemplary aspect, the present disclosure is directed to a monolithic stacked integrated circuit (IC) known-good-layer (KGL) test pattern generation method. The method includes receiving a circuit design of the IC. The circuit design includes a first layer, a second layer, and a scan chain. The scan chain includes a first scan segment in the first layer and a second scan segment in the second layer. The second layer includes a first test input, coupled to an input of the second scan segment. The second layer further includes a first multiplexer. The first multiplexer includes a first data input, a second data input, a first selection input and a first data output wherein the first data input is coupled to the first test input and the second data input is coupled to an output of the second scan segment. The second layer further includes a first test output, coupled to the first data output. The second layer further includes a second test input and a second multiplexer. The second multiplexer includes a third data input, a fourth data input, a second selection input and a second data output wherein the third data input is coupled to the second test input and the fourth data input is coupled to the first data output. The second layer further includes a second test output, coupled to the second data output. The first layer includes a third test input coupled to an input of the first scan segment, a third test output, and a means for coupling the third test output to an output of the first scan segment. The circuit design further includes a means for coupling the first test output to the third test input and a means for coupling the third test output to the second test input. The method further includes configuring the third test input as a scan input, configuring the third test output as a scan output, and generating test patterns for detecting faults at the first layer. The method further includes configuring the first test input as another scan input, configuring the second test output as another scan output, and generating test patterns for detecting faults at the second layer.

In another exemplary aspect, the present disclosure is directed to a monolithic stacked integrated circuit (IC) manufacture fault testing method. The testing method includes receiving a base layer of the IC, wherein the base layer includes a substrate, a first surface, and a second surface. The testing method further includes attaching a first plurality of probe pads to the first surface, wherein the first plurality of probe pads electrically contacts the base layer. The testing method further includes applying a first fault testing through the first plurality of probe pads. The testing method further includes forming an insulation layer over the base layer. The testing method further includes forming an upper layer of the IC over the insulation layer. The upper layer has a third surface and a fourth surface. The third surface is over the insulation layer. The upper layer electrically contacts the base layer. The testing method further includes attaching a second plurality of probe pads to the fourth surface, wherein the second plurality of probe pads electrically contacts the upper layer. The testing method further includes applying a second fault testing through the second plurality of probe pads.

What is claimed is:

1. A monolithic stacked integrated circuit (IC) comprising a known-good-layer (KGL) test circuit that includes a scan segment in a first layer of the IC, wherein the first layer is an upper layer of the IC, the KGL test circuit comprising:
    a first test input, coupled to an input of the scan segment, to receive a first scan shift data;
    a first multiplexer, the first multiplexer having a first data input, a second data input, a first selection input, and a first data output wherein the first data input is coupled to the first test input and the second data input is coupled to an output of the scan segment;
    a first test output, coupled to the first data output, to send a second scan shift data to a second layer;
    a second test input, to receive a third scan shift data from the second layer;
    a second multiplexer, the second multiplexer having a third data input, a fourth data input, a second selection input, and a second data output wherein the third data input is coupled to the second test input and the fourth data input is coupled to the first data output;
    a second test output, coupled to the second data output, to send a fourth scan shift data;
    a first control element, coupled to the first selection input; and
    a second control element, coupled to the second selection input.

2. The IC of claim 1, wherein:
    the first control element is: an input to the first layer or a programmable register in the first layer; and
    the second control element is: another input to the first layer or another programmable register in the first layer.

3. The IC of claim 1, wherein the control elements are registers programmed using one of:
    a second scan chain, the second scan chain having the control elements;
    an IEEE 1149.1 interface; and
    an IEEE 1500 interface.

4. The IC of claim 1, wherein:
    the second layer is one of: a base layer of the IC and another upper layer of the IC; and
    the first layer is over the second layer.

5. The IC of claim 1, wherein the scan segment is register-based.

6. The IC of claim 1, wherein:
    the first control element is a fixed value thereby the first control element and the first multiplexer are degenerated; and
    the first test output and the fourth data input are coupled to the output of the scan segment.

7. The IC of claim 1, wherein:
    the control elements are fixed values thereby the control elements and the multiplexers are degenerated; and
    the second test output is coupled to the output of the scan segment.

8. A method for generating a monolithic stacked integrated circuit (IC) known-good-layer (KGL) test pattern, the method comprising:
    receiving a circuit design of the IC, wherein:
        the circuit design includes a first layer, a second layer and a scan chain;
        the scan chain includes a first scan segment in the first layer and a second
        scan segment in the second layer;
        the second layer includes:
            a first test input, coupled to an input of the second scan segment;
            a first multiplexer, the first multiplexer having a first data input, a second data input, a first selection input and a first data output wherein the first data input is coupled to the first test input and the second data input is coupled to an output of the second scan segment;
            a first test output, coupled to the first data output;
            a second test input;
            a second multiplexer, the second multiplexer having a third data input, a fourth data input, a second selection input and a second data output wherein the third data input is coupled to the second test input and the fourth data input is coupled to the first data output; and
            a second test output, coupled to the second data output;
        the first layer includes a third test input coupled to an input of the first scan segment, a third test output, and a means for coupling the third test output to an output of the first scan segment; and
        the circuit design further includes a means for coupling the first test output to the third test input and a means for coupling the third test output to the second test input;
    configuring the third test input as a scan input;
    configuring the third test output as a scan output;
    generating test patterns for detecting faults at the first layer;
    configuring the first test input as another scan input;
    configuring the second test output as another scan output; and generating test patterns for detecting faults at the second layer.

9. The method of claim 8, further comprising, before the generating the test patterns for detecting faults at the second layer:
configuring the first selection input thereby passing to the first data output one of: the first data input and the second data input; and
configuring the second selection input thereby passing to the second data output one of:
the third data input and the fourth data input.

10. The method of claim 9, wherein the configuring the first and the second selection inputs uses one of:
inputs at the second layer;
a second scan chain, the second scan chain having a plurality of scan flip-flops at the second layer;
an IEEE 1149.1 interface at the second layer; and
an IEEE 1500 interface at the second layer.

11. The method of claim 8, wherein:
the first layer is one of: a base layer of the IC or an upper layer of the IC;
the second layer is another upper layer of the IC; and
the second layer is over the first layer.

12. A monolithic stacked integrated circuit (IC) known-good-layer (KGL) fault testing method, comprising:
receiving a base layer of the IC, the base layer having a substrate, a first surface, and a second surface;
attaching a first plurality of probe pads to the first surface, the first plurality of probe pads electrically contacting the base layer;
applying a first fault testing through the first plurality of probe pads;
forming an insulation layer over the base layer;
forming an upper layer of the IC over the insulation layer, wherein the upper layer has a third surface and a fourth surface, the third surface is over the insulation layer, and the upper layer electrically contacts the base layer;
attaching a second plurality of probe pads to the fourth surface, the second plurality of probe pads electrically contacting the upper layer; and
applying a second fault testing through the second plurality of probe pads.

13. The IC testing method in claim 12, further comprising, detaching the first plurality of probe pads before the forming the insulation layer over the base layer.

14. The IC testing method in claim 12, wherein the forming the insulation layer over the base layer includes:
depositing a dielectric material layer over the base layer; and
performing a polishing process to the dielectric material layer.

15. The IC testing method in claim 12, wherein the substrate includes silicon.

16. The IC testing method in claim 12, wherein the first surface is a surface of the substrate.

17. The IC testing method in claim 12, wherein the upper layer electrically contacts the base layer using vias through the third surface, the insulation layer, and the second surface.

18. The IC testing method in claim 12, wherein:
the IC includes KGL test circuits in at least the upper layer; and
the first and the second fault testing use KGL test patterns.

19. The IC of claim 1, wherein:
the IC includes a third layer;
the second layer is over the third layer;
the first layer is over the second layer; and
the KGL test circuit includes a scan chain that go through the first, second, and third layers.

20. The method of claim 8, further comprising:
generating test patterns for detecting faults at both the first and second layers.

\* \* \* \* \*